US009887830B2

(12) United States Patent
Asada et al.

(10) Patent No.: US 9,887,830 B2
(45) Date of Patent: Feb. 6, 2018

(54) CLOCK GENERATING APPARATUS AND CLOCK DATA RECOVERING APPARATUS

(71) Applicant: THINE ELECTRONICS, INC., Tokyo (JP)

(72) Inventors: Kunihiro Asada, Tokyo (JP); Tetsuya Iizuka, Tokyo (JP); Norihito Tohge, Tokyo (JP); Toru Nakura, Tokyo (JP); Satoshi Miura, Tokyo (JP); Yoshimichi Murakami, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 15/408,631

(22) Filed: Jan. 18, 2017

(65) Prior Publication Data

US 2017/0214513 A1     Jul. 27, 2017

(30) Foreign Application Priority Data

Jan. 21, 2016  (JP) .................................. 2016-009903

(51) Int. Cl.
| | |
|---|---|
| *H04L 7/00* | (2006.01) |
| *H04L 7/02* | (2006.01) |
| *H03L 7/081* | (2006.01) |
| *H04L 7/033* | (2006.01) |

(52) U.S. Cl.
CPC ............ *H04L 7/0037* (2013.01); *H03L 7/081* (2013.01); *H04L 7/02* (2013.01); *H04L 7/0337* (2013.01)

(58) Field of Classification Search
CPC ....... H04L 7/0037; H04L 7/02; H04L 7/0337; H03L 7/081
See application file for complete search history.

(56) References Cited

U.S. PATENT DOCUMENTS

| | | | | |
|---|---|---|---|---|
| 2009/0243677 | A1* | 10/2009 | Becker ..................... | G11C 7/22 327/158 |
| 2010/0073058 | A1* | 3/2010 | Ohtomo ................... | H03K 5/06 327/175 |

FOREIGN PATENT DOCUMENTS

JP    2014-60520 A    4/2014

OTHER PUBLICATIONS

Jun Terada et al., "A 10.3125Gb/s Burst-Mode CDR Circuit using a ΔΣ DAC", ISSCC Dig. Tech. Papers, 2008, Session 11, 11.4, pp. 226-227 (total 3 pages).

* cited by examiner

*Primary Examiner* — Vineeta Panwalkar
(74) *Attorney, Agent, or Firm* — Sughrue Mion, PLLC

(57) ABSTRACT

This embodiment relates to a clock data recovering apparatus capable of improving consecutive identical digits (CID) resistance. The clock data recovering apparatus includes a clock generating apparatus. The clock generating apparatus includes a signal selection unit, a phase detection unit, a phase control unit, a selection unit, a phase delay unit, a time measurement unit, and a phase selection unit. The phase delay unit includes a plurality of delay elements. The phase selection unit selectively outputs an output signal of any one of the plurality of delay elements as a feedback clock. The phase detection unit detects a phase relation between an edge signal and the feedback clock. The phase control unit outputs a control signal to control a signal selection operation by the phase selection unit such that a phase difference detected by the phase detection unit decreases, to the phase selection unit.

10 Claims, 23 Drawing Sheets

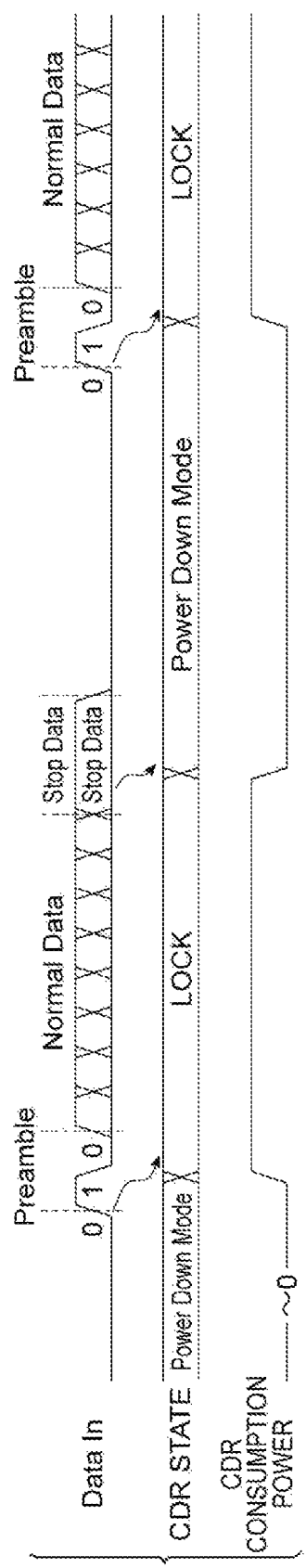

CLOCK GENERATING APPARATUS AND CLOCK DATA RECOVERING APPARATUS

TECHNICAL FIELD

The present invention relates to a clock generating apparatus to generate a clock and a clock data recovering apparatus including the clock generating apparatus.

BACKGROUND

A clock and data are superposed on a digital signal transmitted from a transmitter to a receiver and the clock and the data need to be recovered at the side of the receiver. A clock data recovering (CDR) apparatus to perform the recovery is described in J. Terada, et al. "A 10.3125 Gb/s Burst-Mode CDR Circuit using a ΔΣDAC," ISSCC Dig. Tech. Papers, pp. 226-227 (2008) (Non-Patent Document 1), for example.

The clock data recovering apparatus described in Non-Patent Document 1 detects an edge of an input signal, recovers a clock on the basis of timing of the edge, and recovers data of the input signal at each timing indicated by the clock. A clock generating apparatus that is included in the clock data recovering apparatus and generates a recovered clock includes a phase lock loop (PLL) that is configured to include a gated voltage controlled oscillator (GVCO), a divider, a phase difference detector, an up-down counter, and a DA converter of a ΔΣ system.

The clock data recovering apparatus described in Non-Patent Document 1 is an apparatus that operates in a burst mode. That is, the clock generating apparatus receives a reference clock from the outside before a signal input starts or during the signal input and outputs a clock of the same frequency as a frequency of the reference clock. If the signal input starts, the clock generating apparatus matches a phase of the clock with a phase of an input signal in short time and outputs the clock.

In addition, a clock data recovering apparatus described in Japanese Patent Application Laid-Open No. 2014-60520 (Patent Document 1) is an apparatus that operates in a burst mode. If a signal input starts, the clock data recovering apparatus can match a phase of a clock with a phase of an input signal in short time and can output the clock. The clock data recovering apparatus does not need to receive a reference clock from the outside and can reduce a circuit scale.

SUMMARY

The inventors have examined the related art and have found the following problems as a result thereof. That is, because the clock data recovering apparatus of the burst mode can start to recover the clock and the data in short time after the signal input starts, the clock data recovering apparatus is useful for a use (particularly, a mobile use) where a standby period in which a signal is not input and an operation period in which a signal is input alternately exist. However, in the clock data recovering apparatus described in Non-Patent Document 1, the circuit scale of the clock generating apparatus increases. In addition, a circuit to generate the reference clock input to the clock generating apparatus is necessary. For this reason, a manufacturing cost increases.

In the clock data recovering apparatus described in Patent Document 1, the above problems are resolved. However, in the clock data recovering apparatus, a frequency of the recovered clock and a bit rate of the input signal may not be matched with each other. For this reason, if a period in which a level of the input signal does not change is long, a phase difference between the clock and the input signal may be accumulated, which results in failing in the recovery of the data. That is, in the clock data recovering apparatus described in Patent Document 1, consecutive identical digits (CID) resistance may be bad.

The present invention has been made to resolve the above problems and an object thereof is to provide a cluck generating apparatus and a clock data recovering apparatus capable of improving CID resistance.

According to an aspect of the present invention, a clock generating apparatus includes a signal selection unit, a phase delay unit, a time measurement unit, a phase selection unit, a phase detection unit, and a phase control unit. The signal selection unit receives a feedback clock, an edge signal having an edge at timing according to a bit rate, and an edge detection signal to be at a significant level over a constant period including the timing of the edge of the edge signal. In addition, the signal selection unit selectively outputs the edge signal in a period in which the edge detection signal is at a significant level and selectively outputs a signal obtained by logically inverting the feedback clock in a period in which the edge detection signal is at a non-significant level. The phase delay unit includes a plurality of delay elements connected in cascade. In addition, the phase delay unit inputs the signal outputted from the signal selection unit to a delay element of an initial step among the plurality of delay elements and outputs a signal of a delayed amount according to a position of each of the plurality of delay elements. The time measurement unit detects a level change position of a signal outputted from each of the plurality of delay elements and measures a unit interval time from timing of a certain edge of the edge signal to timing of the edge when a time corresponding to one bit passes. The phase selection unit selectively outputs a signal outputted from a delay element at a position corresponding to the unit interval time measured by the time measurement unit among the plurality of delay elements as the feedback clock. In addition, the phase selection unit selectively outputs a signal outputted from any delay element among the plurality of delay elements as a clock of a frequency corresponding to a bit rate of the edge signal. The phase detection unit detects a phase relation between the edge signal and the feedback clock. The phase control unit controls a signal selection operation by the phase selection unit, such that a phase difference detected by the phase detection unit decreases.

According to another aspect of the present invention, a clock data recovering apparatus includes the clock generating apparatus having the above structure, an edge detection unit, a polarity detection unit, a logic inversion unit, and a data output unit.

BRIEF DESCRIPTION OF THE DRAWINGS

FIG. 12 is a diagram illustrating an operation sequence of the clock data recovering apparatus 1 according to the first embodiment.

DETAILED DESCRIPTION

[Description of Embodiments of Present Invention]

Figure 1:
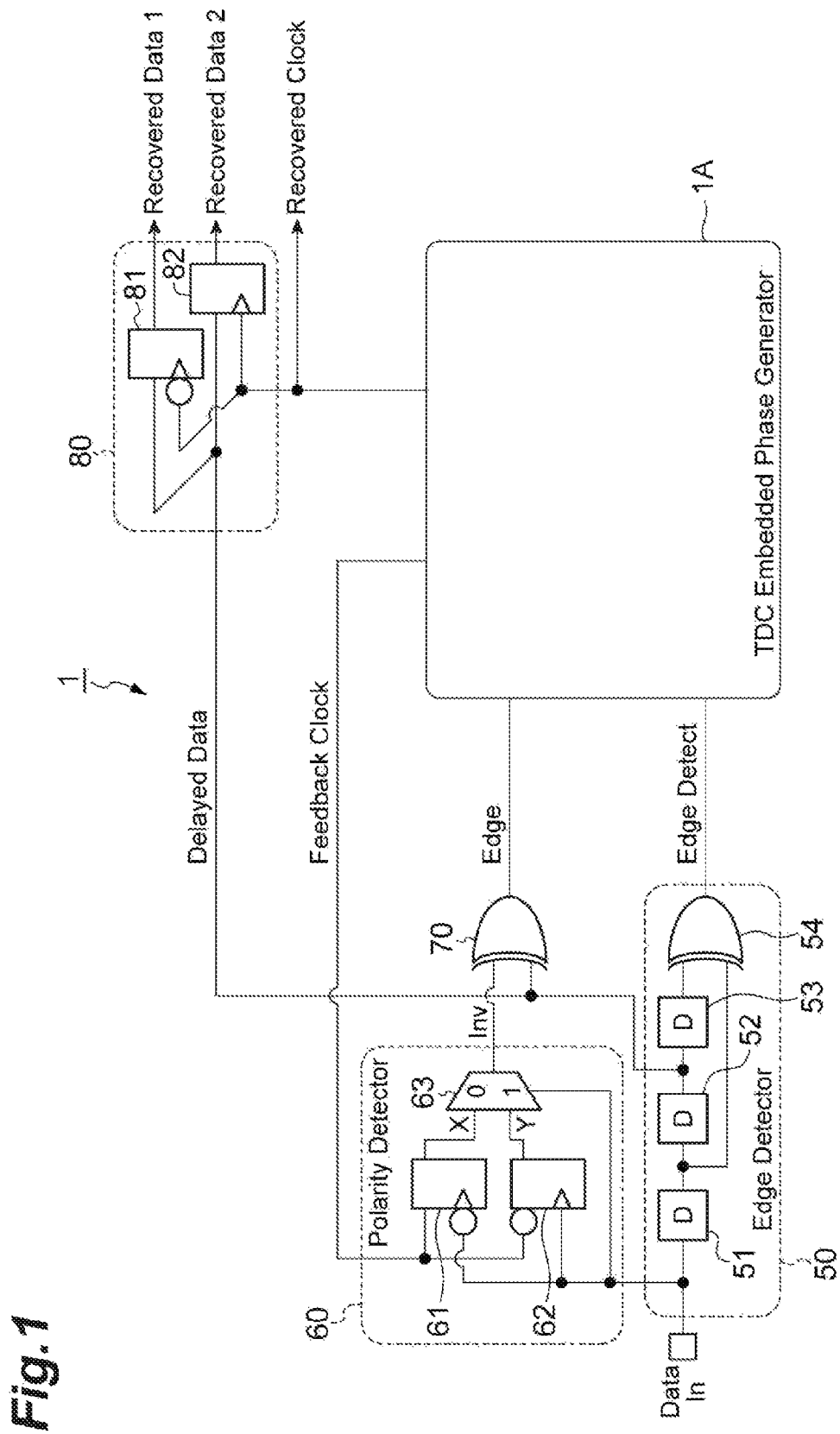
FIG. 1 is a diagram illustrating a configuration of a clock data recovering apparatus 1 according to a first embodiment.

First, embodiments of the present invention will be described.

(1) As a first aspect, a clock generating apparatus according to this embodiment includes a signal selection unit, a phase delay unit, a time measurement unit, a phase selection unit, a phase detection unit, and a phase control unit. The signal selection unit receives a feedback clock, an edge signal having an edge at timing according to a bit rate, and an edge detection signal to be at a significant level over a constant period including the timing of the edge of the edge signal. In addition, the signal selection unit selectively outputs the edge signal in a period in which the edge detection signal is at a significant level. Meanwhile, the signal selection unit selectively outputs a signal obtained by logically inverting the feedback clock in a period in which the edge detection signal is at a non-significant level. The phase delay unit includes a plurality of delay elements connected in cascade. In addition, the phase delay unit inputs the signal outputted from the signal selection unit to a delay element of an initial step among the plurality of delay elements and outputs a signal of a delayed amount according to a position of each of the plurality of delay elements. The time measurement unit detects a level change position of a signal outputted from each of the plurality of delay elements and measures a unit interval time from timing of a certain edge of the edge signal to timing of the edge when a time corresponding to one bit passes. The phase selection unit selectively outputs a signal outputted from a delay element at a position corresponding to the unit interval time measured by the time measurement unit among the plurality of delay elements as the feedback clock. In addition, the phase selection unit selectively outputs a signal outputted from any delay element among the plurality of delay elements as a clock of a frequency corresponding to a bit rate of the edge signal. The phase detection unit detects a phase relation between the edge signal and the feedback clock. The phase control unit controls a signal selection operation by the phase selection unit, such that a phase difference detected by the phase detection unit decreases.

(2) As a second aspect applicable to the first aspect, the clock generating apparatus according to this embodiment may include a plurality of phase delay units $D_1$ to $D_N$ (N is an integer of 2 or more) as the phase delay unit, a plurality of time measurement units $M_1$ to $M_N$ as the time measurement unit, and a plurality of phase selection units $S_1$ to $S_N$ as the phase selection unit. In this configuration, an n-th (n is an integer between 1 and N) phase delay unit $D_n$ among the plurality of phase delay units $D_1$ to $D_N$ includes a plurality of delay elements connected in cascade. A delayed time of each of the plurality of delay elements of the n-th phase delay unit $D_n$ and a delayed time of each of a plurality of delay elements of an n1-st (n1 is an integer between 1 and N) phase delay unit $D_{n1}$ are preferably different from each other. An n-th time measurement unit $M_n$ among the plurality of time measurement units $M_1$ to $M_N$ detects a level change position of a signal outputted from each of the plurality of delay elements of the n-th phase delay unit $D_n$ and measures the unit interval time. An n-th phase selection unit $S_n$ among the plurality of phase selection units $S_1$ to $S_N$ selectively outputs a signal, which is measured by the n-th time measurement unit $M_n$ and is outputted from a delay element at a position corresponding to the unit interval time among the plurality of delay elements of the n-th phase delay unit $D_n$, as the feedback clock. The signal selection unit receives the feedback clock outputted from the n-th phase selection unit $S_n$ and the first phase delay unit $D_1$ inputs the signal outputted from the signal selection unit to a delay element of an initial step of the first phase delay unit $D_1$. Meanwhile, the second to N-th phase delay units $D_2$ to $D_N$ other than the first phase delay unit $D_1$ input the feedback clock outputted from the (n−1)-th phase selection unit $S_{n-1}$ to delay elements of initial steps of the second to N-th phase delay units $D_2$ to $D_N$, respectively. The n-th phase selection unit $S_n$ selectively outputs a signal outputted from any delay element among the plurality of delay elements of the n-th phase delay unit $D_n$ as the clock. The phase control unit controls a signal selection operation by any phase selection unit among the plurality of phase selection units $S_1$ to $S_N$.

(3) As a third aspect applicable to at least one aspect of the first and second aspects, a delayed time of a delay element located at a final step side in two delay elements selected from the plurality of delay elements connected in cascade in the phase delay unit is preferably longer than a delayed time of a delay element located at an initial step side.

(4) As a fourth aspect, a clock data recovering apparatus according to this embodiment is an apparatus for recovering a clock and data using an input signal. The clock data recovering apparatus includes the clock generating apparatus according to any one of the first to third aspects, an edge detection unit, a polarity detection unit, a logic inversion unit, and a data output unit. By this configuration, the clock data recovering apparatus outputs the clock outputted from the clock generating apparatus as a recovered clock recovered using the input signal and outputs the sampling data outputted from the data output unit as recovered data recovered using the input signal. The edge detection unit delays the input signal to generate a delayed input signal and generates an edge detection signal to be at a significant level over a constant period including timing of an edge of the delayed input signal. In addition, the edge detection unit outputs the edge detection signal to the clock generating apparatus. The polarity detection unit generates a logic inversion indication signal to be at a significant level when polarities of edges of the feedback clock and the delayed input signal are the same in a period in which the edge detection signal is at a significant level. The logic inversion unit receives the delayed input signal outputted from the edge detection unit and the logic inversion indication signal outputted from the polarity detection unit. In addition, the logic inversion unit outputs a signal obtained by logically inverting the delayed input signal as the edge signal to the clock generating apparatus in a period in which the logic inversion indication signal is at a significant level. Meanwhile, the logic inversion unit outputs the delayed input signal as the edge signal to the clock generating apparatus in a period in which the logic inversion indication signal is at a non-significant level. The data output unit samples data of the delayed input signal at timing indicated by the clock outputted from the clock generating apparatus and outputs held sampling data.

(5) As a fifth aspect applicable to the fourth aspect, the clock data recovering apparatus may further include an input signal phase detection unit and an input signal phase adjustment unit. The input signal phase detection unit detects a phase relation between the feedback clock and the delayed input signal. The input signal phase adjustment unit adjusts a phase of the delayed input signal input to the data output unit to optimize the phase relation detected by the input signal phase detection unit, that is, to decrease a phase difference of the feedback clock and the delayed input signal.

Each aspect enumerated in a section of [Description of embodiments of present invention] is applicable to each of the remaining aspects or all combinations of the remaining aspects.

[Details of Embodiments of Present Invention]

Hereinafter, specific structures of a clock generating apparatus and a clock data recovering apparatus according to this embodiment will be described in detail with reference to the accompanying drawings. However, it is intended that the present invention is not limited to the exemplary embodiments and all changes within the scope of the appended claims and their equivalents are included in the present invention. In addition, in description of the drawings, the same elements are denoted with the same reference numerals and overlapped explanation is omitted.

First Embodiment

Figure 2:
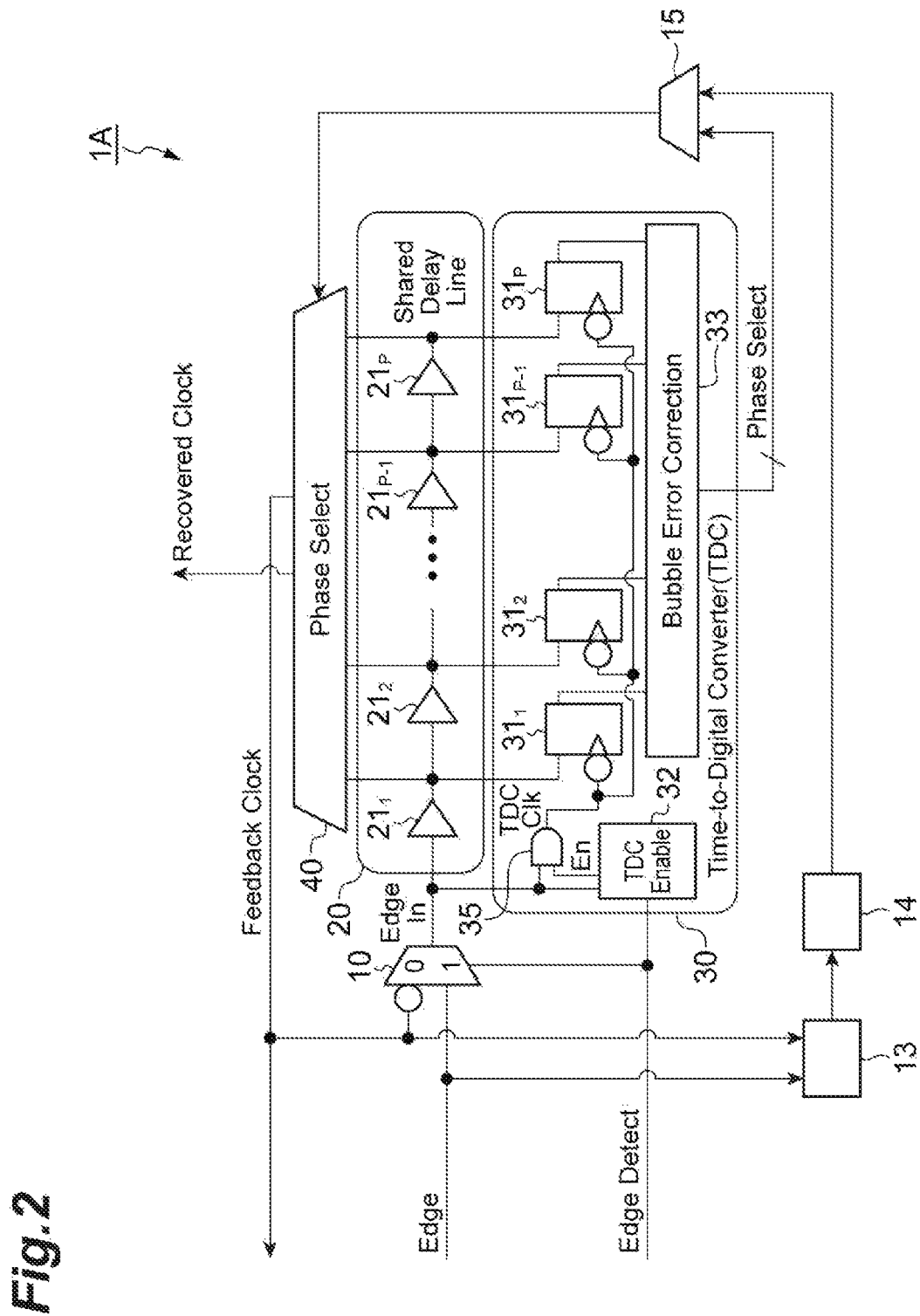
FIG. 2 is a diagram illustrating a configuration of a clock generating apparatus 1A.

FIG. 1 is a diagram illustrating a configuration of a clock data recovering apparatus 1 according to a first embodiment. FIG. 2 is a diagram illustrating a configuration of a clock generating apparatus 1A included in the clock data recovering apparatus 1. As illustrated in FIG. 1, the clock data recovering apparatus 1 is an apparatus to generate a recovered clock (Recovered Clock) and recovered data (Recovered Data), on the basis of an input signal (Data In), and includes the clock generating apparatus (corresponding to a "TDC Embedded Phase Generator" of FIG. 1) 1A, an edge detection unit (corresponding to an "Edge Detector" of FIG. 1) 50, a polarity detection unit (corresponding to a "Polarity Detector" of FIG. 1) 60, a logic inversion unit 70, and a data output unit 80. As illustrated in FIG. 2, the clock generating apparatus 1A includes a signal selection unit 10, a phase detection unit 13, a phase control unit 14, a selection unit 15, a phase delay unit (corresponding to a "Shared Delay Line" of FIG. 2) 20, a time measurement unit (corresponding to a "Time-to-Digital Converter (TDC) of FIG. 2) 30, and a phase selection unit (corresponding to a "Phase Select" of FIG. 2) 40.

The signal selection unit 10 receives a feedback clock (Feedback Clock) outputted from the phase selection unit 40, an edge signal (Edge) outputted from the logic inversion unit 70, and an edge detection signal. (Edge Detect) outputted from the edge detection unit 50. The edge signal is a signal that is generated on the basis of the input signal (Data in) and the feedback clock (Feedback Clock). The edge signal has the same bit rate as a bit rate of the input signal and has an edge at timing according to the bit rate. The edge detection signal is a signal that is at a significant level over a constant period including the timing of the edge of the edge signal.

When the edge detection signal is at a significant level, the signal selection unit 10 selects the edge signal and outputs the edge signal to the phase delay unit 20. That is, when the edge detection signal is at a significant level, the edge signal outputted from the logic inversion unit 70 is input to the phase delay unit 20 via the signal selection unit 10.

Meanwhile, when the edge detection signal is at a non-significant level, the signal selection unit 10 selectively outputs a signal obtained by logically inverting the feedback clock to the phase delay unit 20. That is, when the edge detection signal is at a non-significant level, the signal selection unit 10 and the phase selection unit 40 configure a feedback loop. The signal selection unit 10 and the phase selection unit 40 operate like a ring oscillator and oscillate a clock at a frequency according to a delayed time in the phase delay unit 20.

The phase delay unit 20 includes a plurality of (P) delay elements $21_1$ to $21_P$ connected in cascade. The phase delay unit 20 inputs a signal outputted from the signal selection unit 10 to the delay element 21 of an initial step among the delay elements $21_1$ to $21_P$. The phase delay unit 20 outputs a signal of a delayed amount according to each position from each of the delay elements $21_1$ to $21_P$ to the time measurement unit 30 and the phase selection unit 40. A delayed time of each of the delay elements $21_1$ to $21_P$ may be constant.

The time measurement unit 30 detects a level change of the signal outputted from each of the delay elements $21_1$ to $21_P$ of the phase delay unit 20 and measures a unit interval time from timing of the certain edge of the edge signal to timing of the edge when a time corresponding to one bit passes. The time measurement unit 30 configures a Time-to-Digital Converter (TDC) that can output a time measurement result as a digital value. The time measurement unit 30 includes flip-flops $31_1$ to $31_P$, a measurement permission unit 32, an AND circuit 35, and a bubble error correction unit (corresponding to a "Bubble Error Correction" of FIG. 2) 33.

The flip-flops $31_1$ to $31_P$ configure a latch unit that latches data of a signal outputted from each of the delay elements $21_1$ to $21_P$ at predetermined timing. That is, the p-th flip-flop $31_P$ among the P flip-flops $31_1$ to $31_P$ latches data of a signal outputted from the corresponding delay element $21_P$ at the timing of the edge of the signal (Edge In) outputted from the signal selection unit 10, which is permitted by the measurement permission unit 32. The measurement permission unit 32 receives the signal (Edge In) outputted from the signal selection unit 10 and the edge detection signal (Edge Detect) outputted from the edge detection unit 50, determines permission or non-permission of a latch operation by the flip-flops $31_1$ to $31_P$, and outputs a signal (En) to be at a significant level when the latch operation is permitted. When the signal (En) outputted from the measurement permission unit 32 is at a significant level, the AND circuit 35 gives the signal (Edge In) outputted from the signal selection unit 10 to the flip-flops $31_1$ to $31_P$.

The phase error correction unit 33 is provided as a countermeasure against bubbles of P-bit digital data latched and output by the flip-flops $31_1$ to $31_P$ and performs bubble error correction on the P-bit digital data. The time measurement unit 30 outputs the P-bit digital data outputted from the bubble error correction unit 33 as a unit interval time measurement result to the phase selection unit 40 via the selection unit 15.

The phase detection unit 13 detects a phase relation between the edge signal (Edge) and the feedback clock (Feedback Clock). That is, the phase detection unit 13 detects which of phases of the edge signal and the feedback clock is faster and detects the magnitude of a phase difference thereof. Because levels of the edge signal and the feedback clock are opposite to each other, the phase detection unit 13 detects the phase relation of the edge signal and the feedback clock after inverting the level of any one of the edge signal and the feedback clock. The phase detection unit 13 may receive the edge signal input to the signal selection unit 10 as illustrated in the drawings and may receive the signal (Edge In) outputted from the signal selection unit 10 after selecting the edge signal (Edge) by the signal selection unit 10. When the phase detection unit 13 receives the signal (Edge In) outputted from the signal selection unit 10, the phase detection unit 13 preferably receives the feedback clock to which the same delay as the delay in the signal selection unit 10 has been given.

The phase control unit 14 generates a control signal to control a signal selection operation by the phase selection unit 40 such that the phase difference detected by the phase detection unit 13 decreases and outputs the control signal to the phase selection unit 40 via the selection unit 15.

The selection unit 15 selects any one of the p-bit digital data showing the unit interval time measurement result outputted from the bubble error correction unit 33 of the time measurement unit 30 and the control signal outputted from the phase control unit 14 and gives it to the phase selection unit 40. The selection unit 15 determines a state on the basis of the edge detection signal (Edge Detect), selectively gives the P-bit digital data outputted from the time measurement unit 30 to the phase selection unit 40 in a period of a preamble to be described below, and selectively gives the control signal outputted from the phase control unit 14 to the phase selection unit 40 in a period of normal data after the period of the preamble.

The phase selection unit 40 selects a signal outputted from the delay element at a position corresponding to the unit interval time measured by the time measurement unit 30 or a position indicated by the control signal outputted from the phase control unit 14, among the delay elements $21_1$ to $21_P$ of the phase delay unit 20, and outputs the selected signal as the feedback clock (Feedback Clock) to the signal selection unit 10 and the polarity detection unit 60. In addition, the phase selection unit 40 selects a signal outputted from any delay element of the delay elements $21_1$ to $21_P$ of the phase delay unit 20 and outputs the selected signal as a recovered clock (Recovered Clock) of a frequency corresponding to the bit rate of the edge signal to the data output unit 80. Both the recovered clock and the feedback clock are clocks recovered on the basis of the input signal and have frequencies equal to each other and phases different from each other.

The edge detection unit 50 receives the input signal (Data In), generates a delayed input signal (Delayed Data) obtained by giving delay to the input signal, and outputs the generated delayed input signal to the logic inversion unit 70 and the data output unit 80. In addition, the edge detection unit 50 generates an edge detection signal (Edge Detect) to be at a significant level over a constant period including timing of an edge of the delayed input signal and outputs the generated edge detection signal to the signal selection unit 10 and the measurement permission unit 32. The edge detection unit 50 includes delay elements 51 to 53 connected in cascade and an XOR circuit 54. A delayed time D of each of the delay elements 51 to 53 is preferably constant.

The XOR circuit 54 receives a signal obtained by delaying the input signal by the delayed time D by the delay element 51 and a signal Obtained by delaying the input signal by a delayed time 3D by the delay elements 51 to 53 and outputs a signal showing exclusive logical sum of the two signals as an edge detection signal. In addition, the edge detection unit 50 outputs a signal obtained by delaying the input signal by a delayed time 2D by the delay elements 51 and 52 as a delayed input signal.

The polarity detection unit 60 receives the input signal (Data In) and receives the feedback clock (Feedback Clock) outputted from the phase selection unit 40. In addition, the polarity detection unit 60 generates a logic inversion indication signal (INV) on the basis of the signals and outputs the generated logic inversion indication signal to the logic inversion unit 70. The logic inversion indication signal is at a significant level when polarities of the edges of the feedback clock (Feedback Clock) and the delayed input signal (Delayed Data) are the same in a period in which the edge detection signal (Edge Detect) is at a significant level. The polarity detection unit 60 includes flip-flops 61 and 62 and a selector 63.

One flip-flop 61 latches a level of the feedback clock at timing of a falling edge of the input signal. The other flip-flop 62 latches an inversion level of the level of the feedback clock at timing of a rising edge of the input signal. When the input signal is at a low level, the selector 63 outputs a signal (X) outputted from the flip-flop 61 as the logic inversion indication signal and when the input signal is at a high level, the selector 63 outputs a signal (Y) outputted from the flip-flop 62 as the logic inversion indication signal.

The logic inversion unit 70 receives the delayed input signal (Delayed Data) outputted from the edge detection unit 50 and receives the logic inversion indication signal (INV) outputted from the polarity detection unit 60. When the logic inversion indication signal is at a significant level, the logic inversion unit 70 outputs a signal obtained by logically inverting the delayed input signal as an edge signal to the clock generating apparatus. Meanwhile, when the logic inversion indication signal is at a non-significant level, the logic inversion unit 70 outputs the delayed input signal as the edge signal to the clock generating apparatus.

The data output unit 80 receives the recovered clock (Recovered Clock) outputted from the phase selection unit 40 and receives the delayed input signal (Delayed Data) outputted from the edge detection unit 50. In addition, the data output unit 80 samples data of the delayed input signal at timing indicated by the recovered clock and outputs sampling data held once as recovered data (Recovered Data) The data output unit 80 includes flip-flops 81 and 82. The flip-flop 81 samples the data of the delayed input signal at timing of a falling edge of the recovered clock and outputs the sampling data held once. The flip-flop 82 samples the data of the delayed input signal at timing of a rising edge of the recovered clock and outputs the sampling data held once.

Figure 3:
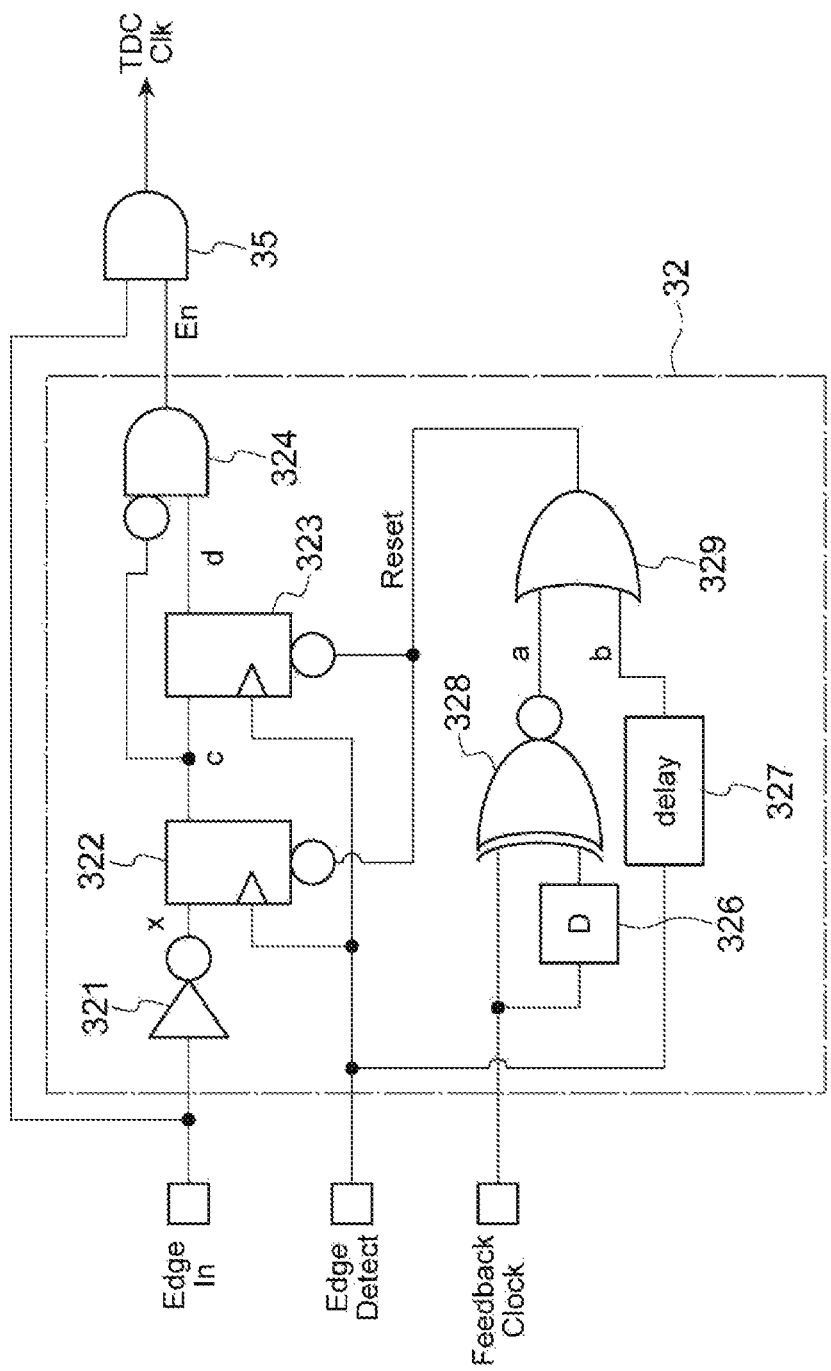
FIG. 3 is a diagram illustrating a circuit configuration example of a measurement permission unit 32 of a time measurement unit 30.

FIG. 3 is a diagram illustrating a circuit configuration example of the measurement permission unit 32 of the time measurement unit 30. The measurement permission unit 32 outputs a signal (En) to generate a signal (TDC Clk) indicating timing of a latch operation by the flip-flops $31_1$ to $31_P$ and includes an INV circuit 321, flip-flops 322 and 323, an AND circuit 324, delay elements 326 and 327, an EXNOR circuit 328, and an OR circuit 329. FIG. 3 also illustrates the AND circuit 35.

The flip-flop 322 latches a signal (x) obtained by logically inverting the signal (Edge In) outputted from the signal selection unit 10 by the INV circuit 321, at timing of a rising edge of the edge detection signal (Edge Detect). The flip-flop 323 latches a signal (c) outputted from the flip-flop 322, at the timing of the rising edge of the edge detection signal (Edge Detect). The flip-flops 322 and 323 are initialized when a signal (Reset) outputted from the OR circuit 329 is at a low level.

The AND circuit 324 receives a signal obtained by logically inverting the signal (c) outputted from the flip-flop 322 and a signal (d) outputted from the flip-flop 323 and outputs a signal (En) showing a logical product of the two signals. The AND circuit 35 outputs a signal (TDC Clk) showing a logical product of the signal (En) outputted from the AND circuit 324 and the signal (Edge in) outputted from the signal selection unit 10.

The EXNOR circuit 328 receives the recovered clock (Recovered. Clock) and a signal obtained by delaying the recovered clock by the delay element 326 and outputs a signal (a) showing inversion of an exclusive logical sum of the two signals. The OR circuit 329 receives the signal (a) outputted from the EXNOR circuit 328 and a signal obtained by delaying the recovered clock by the delay element 327 and outputs a signal (Reset) showing a logical sum of these signals to the flip-flops 322 and 323.

Figure 4:
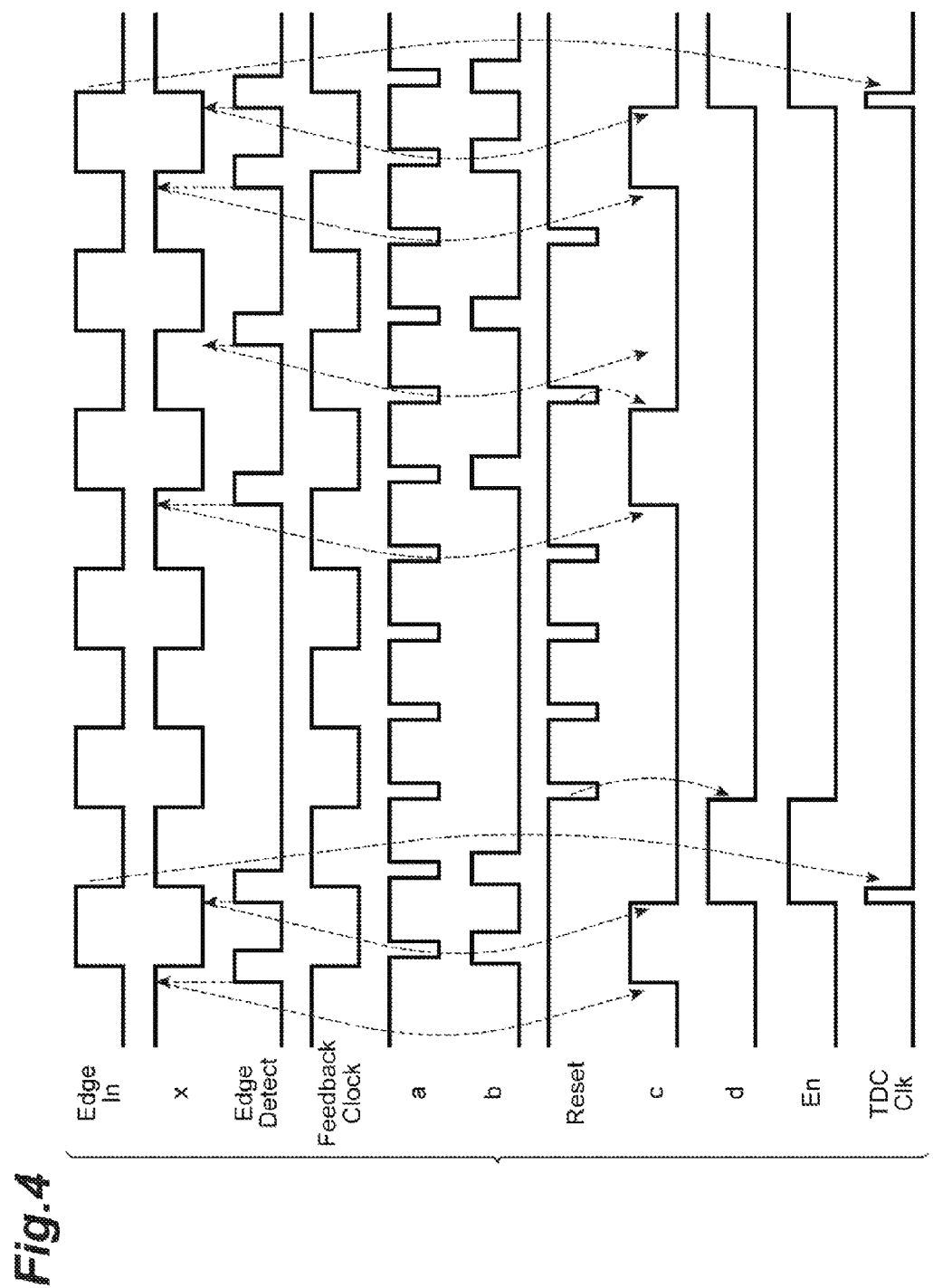
FIG. 4 is a timing chart of each signal in the measurement permission unit 32 of the time measurement unit 30.

FIG. 4 is a timing chart of each signal in the measurement permission unit 32 of the time measurement unit 30. The measurement permission unit 32 finds a rising edge (transition of a level 0→1) and a falling edge (transition of a level 1→0) in the signal (Edge In) outputted from the signal selection unit 10 and outputs the signal (TDC Clk) indicating timing of the latch operation by the flip-flops $31_1$ to $31_P$. The INV circuit 321 and the flip-flops 322 and 323 latch the inversion signal (x) of the signal (Edge In) at timing of the rising edge of the edge detection signal (Edge Detect) and confirm a polarity (rising or falling) of an edge of the signal (Edge In).

The AND circuits 324 and 35 cause the signal (En) to be at a high level, only when the signals (c) and (d) are at a low level and a high level, respectively, and output the signal (Edge In) as the signal (TDC Clk). The delay elements 326 and 327, the EXNOR circuit 328, and the OR circuit 329 combine the feedback clock (Feedback Clock) and the edge detection signal (Edge Detect), reset the flip-flops 322 and 323 when an interval of the edges is more than one unit interval time, and indicate the latch operation by the flip-flops $31_1$ to $31_P$ only when the rising edge and the falling edge are at intervals of one unit interval time.

Figures 5A, 5B:
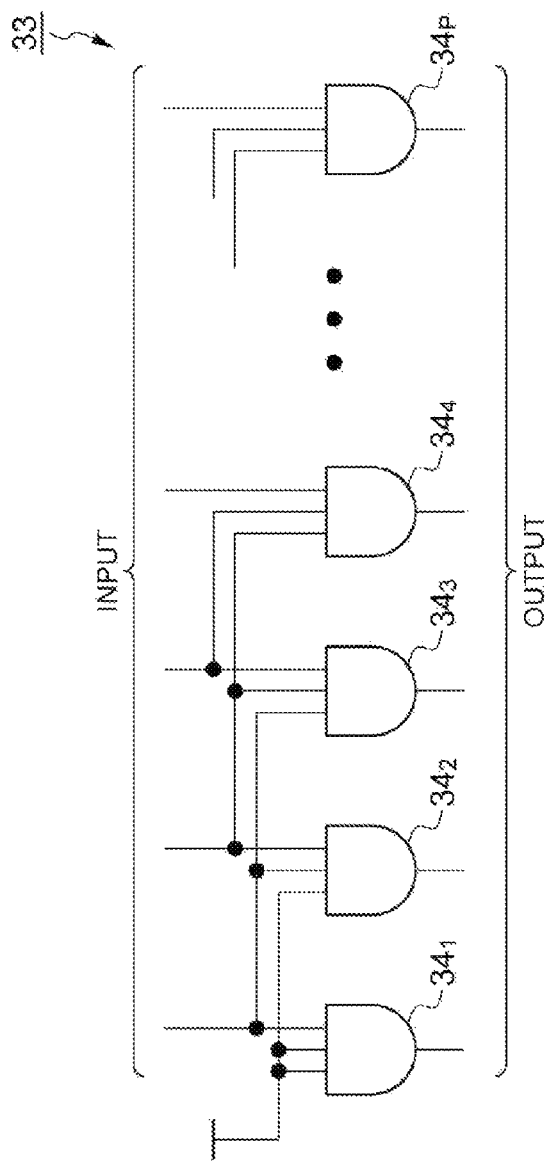
FIGS. 5A and 5B are diagrams illustrating a circuit configuration and an operation of a bubble error correction unit 33 of the time measurement unit 30.

FIG. 5A illustrates an example of a circuit configuration of the bubble error correction unit 33 of the time measurement unit 30 and FIG. 5B illustrates an example of an operation of the bubble error correction unit 33 of the time measurement unit 30. The bubble error correction unit 33 is provided for metastability of the P-bit digital data latched and output by the flip-flops $31_1$ to $31_P$ and performs bubble error correction on the P-bit digital data, so that only one transition from a value 1 to a value 0 occurs as in [11••1100••00].

As illustrated in FIG. 5A, the bubble error correction unit 33 includes P AND circuits $34_1$ to $34_P$ of three inputs. The AND circuit $34_1$ receives a signal outputted from the delay element $21_1$ and outputs the received signal as it is. The AND circuit $34_2$ receives signals outputted from the delay elements $21_1$ and $21_2$ and outputs a signal showing a logical product of the two signals. Each AND circuit $34_P$ other than the AND circuits $34_1$ and $34_2$ among the P AND circuits $34_1$ to $34_P$ receives signals outputted from the delay elements $21_{P-2}$, $21_{P-1}$, and $21_P$ and outputs a signal showing a logical product of the three signals.

FIG. 5B illustrates an example of input/output signals. When P-bit digital data [••11101000••] outputted from the flip-flops $31_1$ to $31_P$ is input to the bubble error correction unit 33, the bubble error correction unit 33 converts the input digital data into P-bit digital data [••11100000••].

Figure 6:
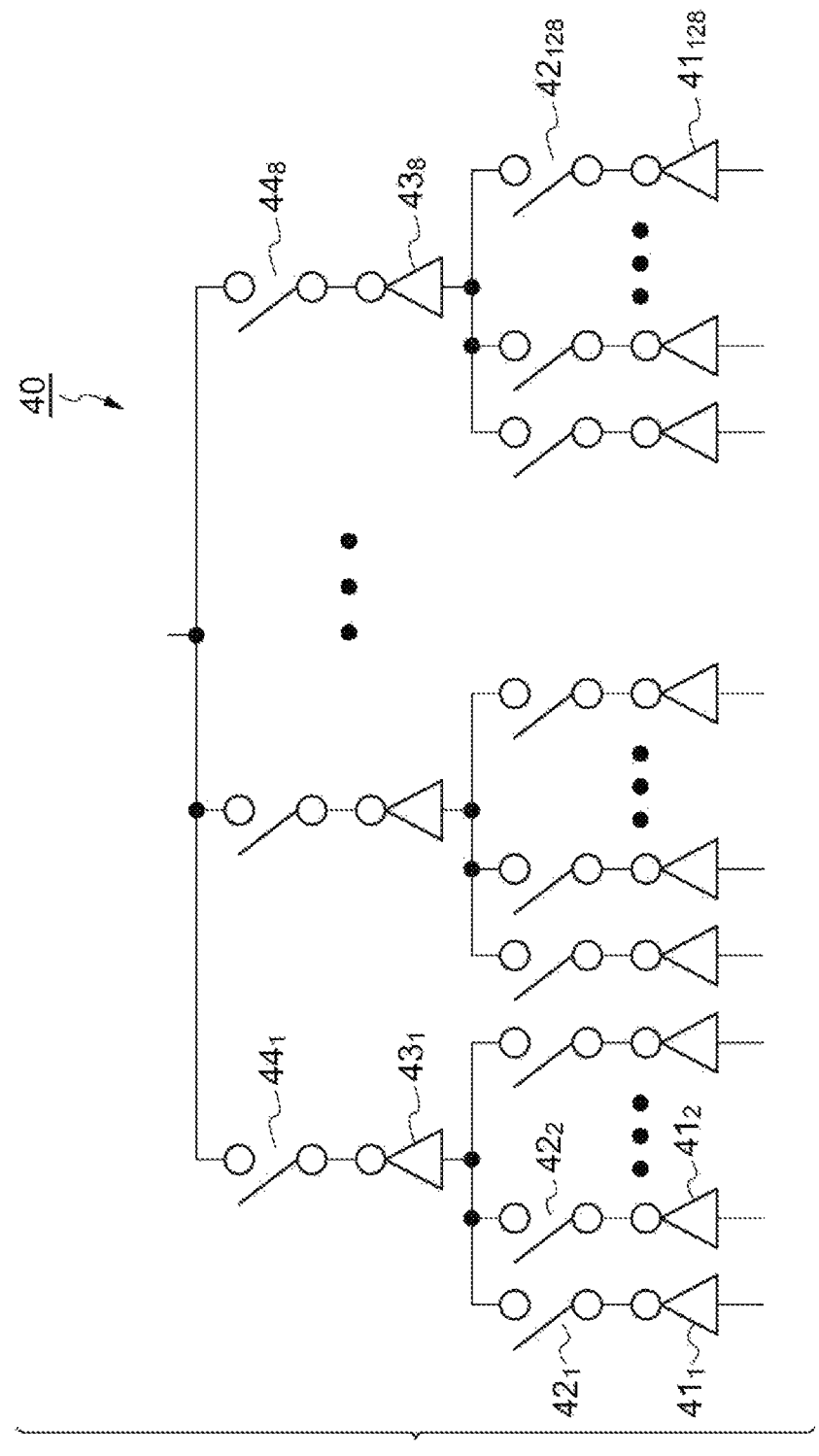
FIG. 6 is a diagram illustrating a circuit configuration example of a phase selection unit 40.

FIG. 6 is a diagram illustrating a circuit configuration example of the phase selection unit 40. The phase selection unit 40 includes a feedback clock selection circuit to select and output the feedback clock and a recovered clock selection circuit to select and output the recovered clock. The feedback clock selection circuit and the recovered clock selection circuit may have the same configuration. In FIG. 6, the feedback clock selection circuit in which P=128 is illustrated.

The feedback clock selection circuit includes 128 INV circuits $41_1$ to $41_{128}$, 128 switches $42_1$ to $42_{128}$, 8 INV circuits $43_1$ to $43_8$, and 8 switches $44_1$ to $44_8$. These INV circuits and switches are provided at a ratio of one set of an INV circuit 43 and a switch 44 with respect to eight sets of INV circuits 41 and switches 42.

Each INV circuit $41_p$, receives a signal outputted from the corresponding delay element $21_P$ and outputs a signal obtained by logically inverting the received signal to the corresponding switch $42_p$. When each switch $42_p$ is closed, each switch $42_1$, causes a signal outputted from the corresponding INV circuit $41_p$ to be input to any INTV circuit $43_{p1}$ of the eight INV circuits $43_1$ to $43_8$. Each INV circuit $43_{p1}$ outputs a signal obtained by logically inverting the input signal to the corresponding switch $44_{p1}$. When each switch $44_{p1}$ is closed, each switch $44_{p1}$ outputs a signal outputted from the corresponding INV circuit $43_{p1}$ as the feedback clock.

The feedback clock selection circuit closes the switch $42_p$ corresponding to the delay element at a position corresponding to the unit interval time among the delay elements $21_1$ to $21_P$ of the phase delay unit 20, closes the switch $44_{p1}$ at a rear step of the switch $42_p$, opens the other switches, selects a signal outputted from the delay element at the position corresponding to the unit interval time, and outputs the selected signal as the feedback clock.

Figure 7:
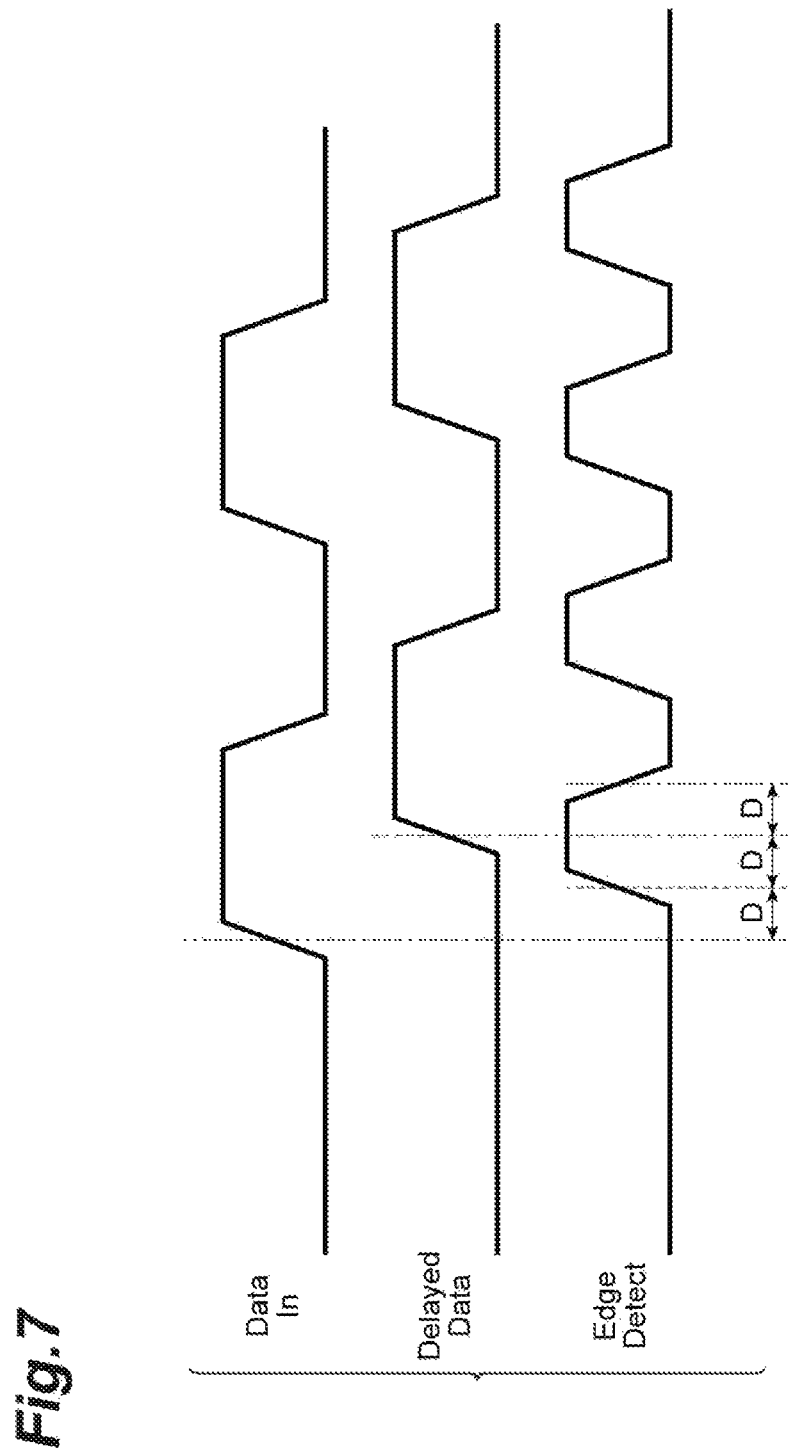
FIG. 7 is a timing chart of each signal in an edge detection unit 50.

FIG. 7 is a timing chart of each signal in the edge detection unit 50. The delayed input signal (Delayed Data) is a signal obtained by delaying the input signal (Data In) by the time 2D. The edge detection signal is at a significant level over a period of the time 2D with its center at timing of each edge of the delayed input signal.

Figure 8:
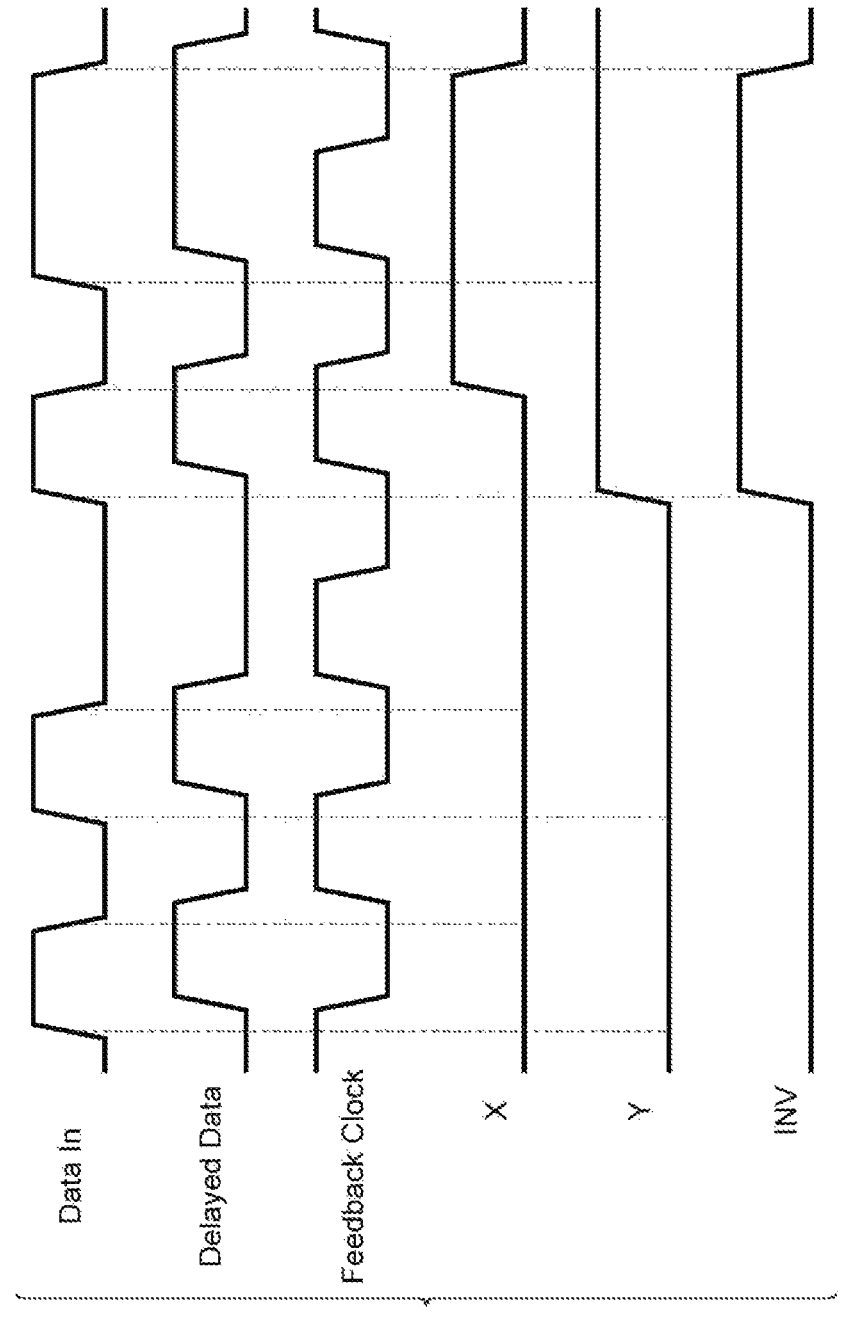
FIG. 8 is a timing chart of each signal in a polarity detection unit 60 and a logic inversion unit 70.

FIG. 8 is a timing chart of each signal in the polarity detection unit 60 and the logic inversion unit 70. FIG. 8 illustrates the input signal (Data In), the delayed input signal (Delayed Data), the feedback clock (Feedback Clock), the signal (X) outputted from the flip-flop 61 of the polarity detection unit 60, the signal (Y) outputted from the flip-flop 62 of the polarity detection unit 60, and the logic inversion indication signal (INV) outputted from the selector 63 of the polarity detection unit 60. As illustrated in FIG. 8, if polarities of the edges of the feedback clock and the delayed input signal are the same, the logic inversion indication signal is at a significant level.

Figure 9:
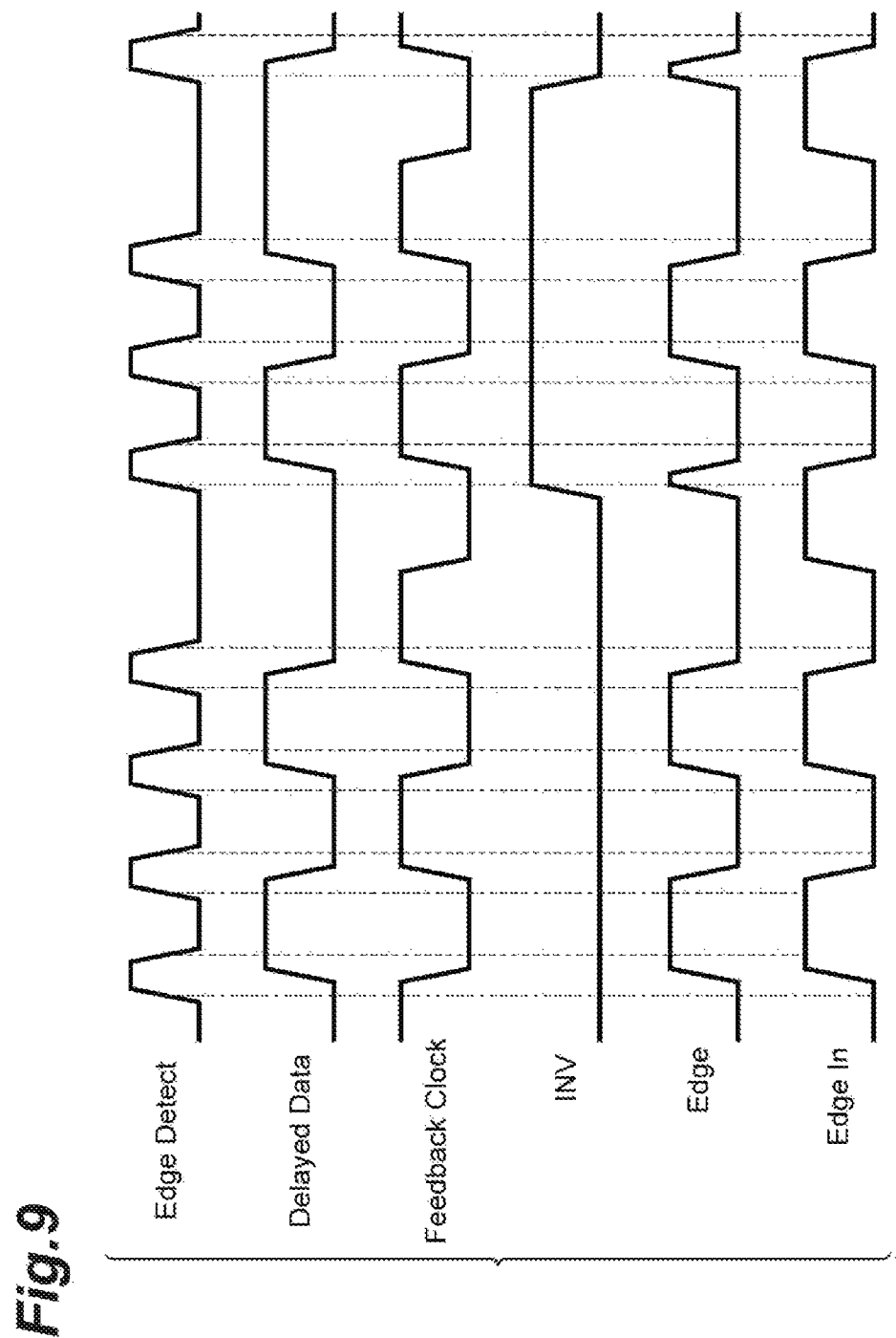
FIG. 9 is a timing chart of each signal in the logic inversion unit 70 and a signal selection unit 10.

FIG. 9 is a timing chart of each signal in the logic inversion unit 70 and the signal selection unit 10. FIG. 9 illustrates the edge detection signal (Edge Detect), the delayed input signal (Delayed Data), the feedback clock (Feedback Clock), the logic inversion indication signal (INV), the edge signal (Edge) inputted from the logic inversion unit 70 to the signal selection unit 10, and the signal (Edge In) outputted from the signal selection unit 10. As illustrated in FIG. 9, the polarities of the edges of the edge signal and the feedback clock become opposite to each other in a period (constant period including timing of the edge of the delayed input signal) in which the edge detection signal is at a significant level. At this time, because the signal (Edge In) outputted from the signal selection unit 10 is matched with the signal obtained by logically inverting the feedback clock, clock oscillation is maintained.

Figure 10:
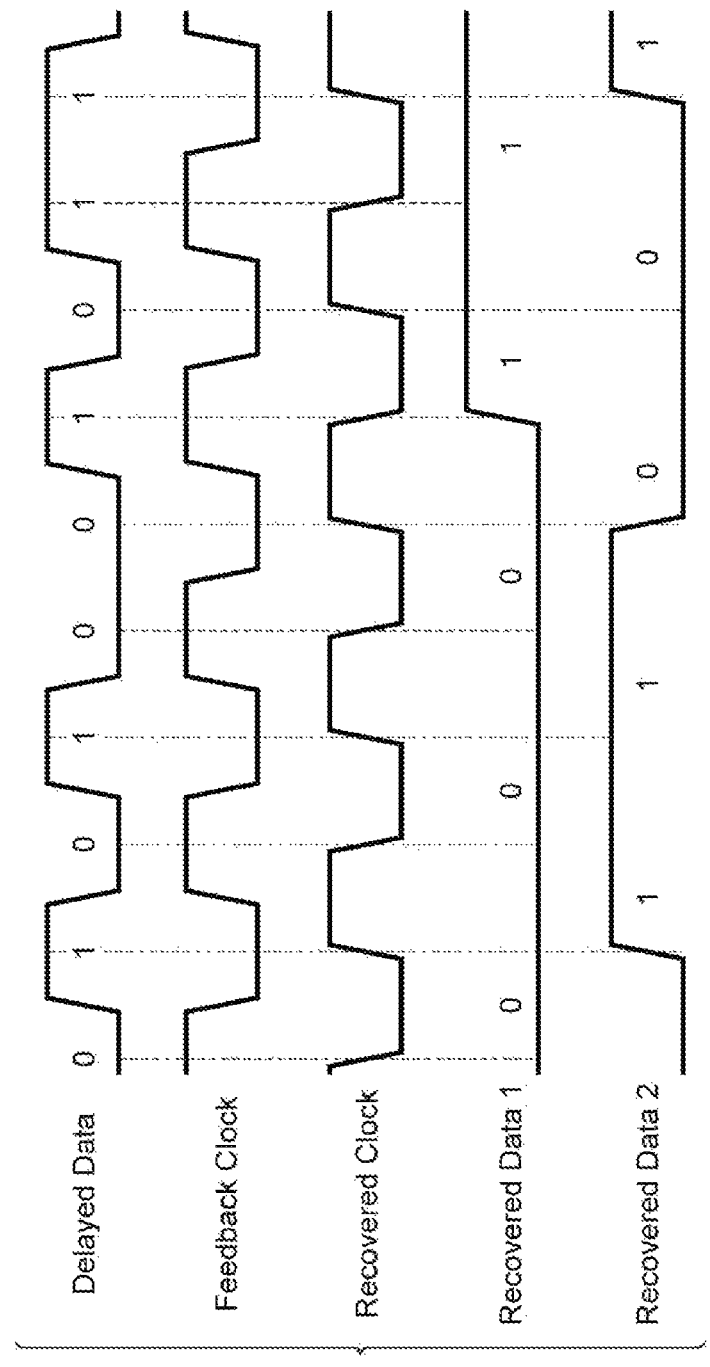
FIG. 10 is a timing chart of each signal in a data output unit 80.

FIG. 10 is a timing chart of each signal in the data output unit 80. FIG. 10 illustrates the delayed input signal (Delayed Data), the feedback clock (Feedback Clock), the recovered clock (Recovered Clock), the recovered data (Recovered Data 1) outputted from the flip-flop 81, and the recovered data (Recovered Data 2) outputted from the flip-flop 82. As illustrated in FIG. 10, frequencies of the feedback clock and the recovered clock are equal to each other, but phases thereof are different from each other. The frequencies of the feedback clock and the recovered clock become ½ of the bit rate (that is, the bit rate of the input signal) of the delayed input signal. The phase (that is, the timing of the edge of the recovered clock) of the recovered clock is set such that there is no sampling error of data of the delayed input signal by the data output unit 80. A difference of the phases of the feedback clock and the recovered, clock is π/2, for example.

Figure 11A:
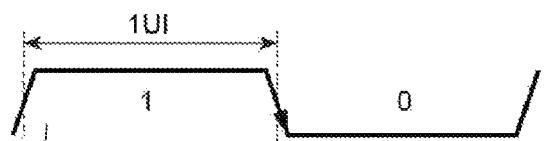
FIGS. 11A to 11C are timing charts of each signal in a phase delay unit 20 and the time measurement unit 30 of the clock generating apparatus 1A.
Figure 11B:
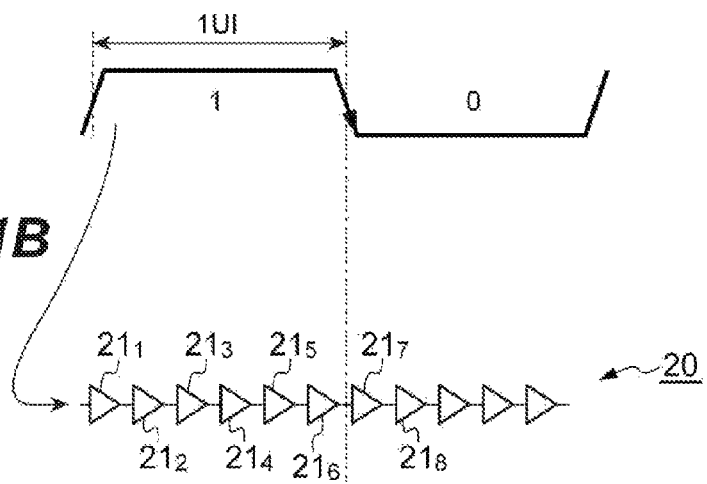
Figure 11C:
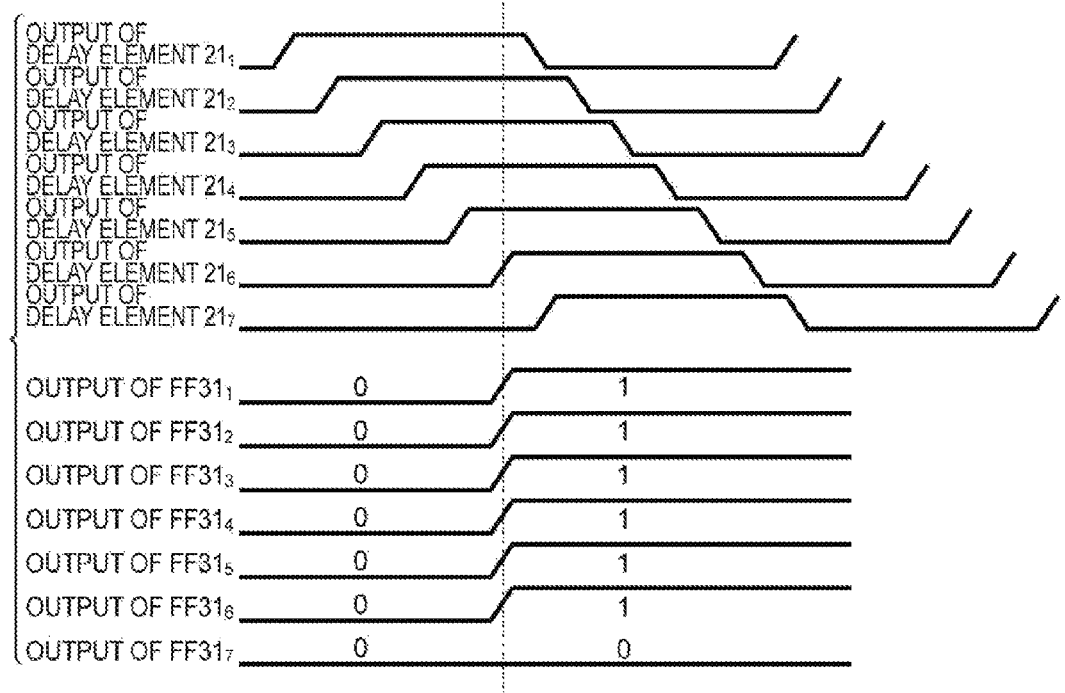

Next, the clock generating apparatus 1A will be described in detail using FIGS. 11A to 11C. FIG. 11A illustrates the signal (Edge in) outputted from the signal selection unit 10, FIG. 11B illustrates a configuration of the phase delay unit 20, and FIG. 11C is a timing chart of each signal in the phase delay unit 20 and the time measurement unit 30 of the clock generating apparatus 1A. Specifically, FIGS. 11A to 11C illustrate timing charts of signals outputted from the delay elements $21_1$ to $21_P$ of the phase delay unit 20 and the flip-flops $31_1$ to $31_P$ of the time measurement unit 30, when data of 3 bits of [010] is input as the signal (Edge In) outputted from the signal selection unit 10.

For example, when the logic inversion indication signal (INV) is at a non-significant level and 3-bit data [010] is input as an input signal, the delayed input signal (Delayed Data) has a rising edge and has a falling edge when the unit interval time passes from the rising edge. The edge detection signal (Edge Detect) is at a significant level over a constant period including individual timings of the two edges of the delayed input signal. Therefore, the same 3-bit data [010] as the delayed input signal is selected as the edge signal (Edge) by the signal selection unit 10 and is input to the phase delay unit 20.

Timing of a rising edge of the signal (Edge in) outputted from the signal selection unit 10 is set as a reference time and a delayed time of each delay element $21_n$ is set as τ. At this time, when a time nit (time shorter than the unit interval time) passes from the reference time, signals outputted from the delay elements $21_1$ to $21_m$ of first to m-th steps among the delay elements $21_1$ to $21_P$ are at a high level and signals outputted from the delay elements $21_1$ to $21_P$ of rear steps thereof are at a low level.

At a point of time when the unit interval time passes from the reference time (that is, at timing of a falling edge of the signal (Edge In) outputted from the signal selection unit 10), if the signals outputted from the delay elements $21_1$ to $21_m$ of the first to m-th steps among the delay elements $21_1$ to $21_P$ are at a high level and the signals outputted from the delay elements $21_{m-1}$ to $21_P$ of the rear steps thereof are at a low level, it is seen that the unit interval time is equal to or larger than mτ and is smaller than (m+1)τ.

At the timing of the falling edge of the signal (Edge In) outputted from the signal selection unit 10, each flip-flop $31_P$ latches data of the signal outputted from the corresponding delay element $21_P$, in this case, the signals outputted from the flip-flops $31_1$ to $31_m$ of the first to m-th steps among the flip-flops $31_1$ to $31_P$ are at a high level and the signals outputted from the flip-flops $31_{m-1}$ to $31_P$ of the rear steps thereof are at a low level.

In the P-bit digital data latched and output by the P flip-flops $31_1$ to $31_P$, values are 1 in first to p-th bits and values are 0 in the remaining (P−p) bits. As a result, the P-bit digital data becomes [11••1100••00]. The time measurement unit 30 acquires the unit interval time from the P-bit digital data. In addition, the phase selection unit 40 selects a signal outputted from the delay element at the position corresponding to the unit interval time among the P delay elements $21_1$ to $21_P$, outputs the signal as the feedback clock (Feedback Clock), and outputs the recovered clock (Recovered Clock).

FIG. 12 is a diagram illustrating an operation sequence of the clock data recovering apparatus 1 according to the first embodiment. FIG. 12 illustrates a waveform of the input signal (Data In) input to the clock data recovering apparatus 1, a state of the clock data recovering apparatus 1, and consumption power of the clock data recovering apparatus 1. As illustrated in FIG. 12, an operation period in which the input signal (Data In) is input and a standby period in which a signal is not input alternately exist. The input signal includes normal data (Normal Data), a preamble (Preamble) added before the normal data, and stop data (Stop Data) added after the normal data.

In the standby period in which the signal is not input, a value of the input signal is maintained at 0. The clock data recovering apparatus 1 is in a power down mode and consumption power thereof is little. If the standby period ends, first, [10] is input as data of the preamble of the input signal. As a result, the clock data recovering apparatus 1 enters a lock state in which oscillation of the recovered clock (Recovered Clock) and the feedback clock (Feedback Clock) of the frequency corresponding to the unit interval time of the data of the preamble is obtained as described above and a clock and data can be recovered. In addition, the recovered clock and the recovered data are obtained on the basis of the normal data input following the preamble. The stop data added after the normal data is data in which values 1 of a constant bit number or more continue. If the stop data is input, the clock data recovering apparatus 1 recognizes that the operation period ends and the standby period starts and enters the power down mode and the consumption power thereof is little.

Figure 13:
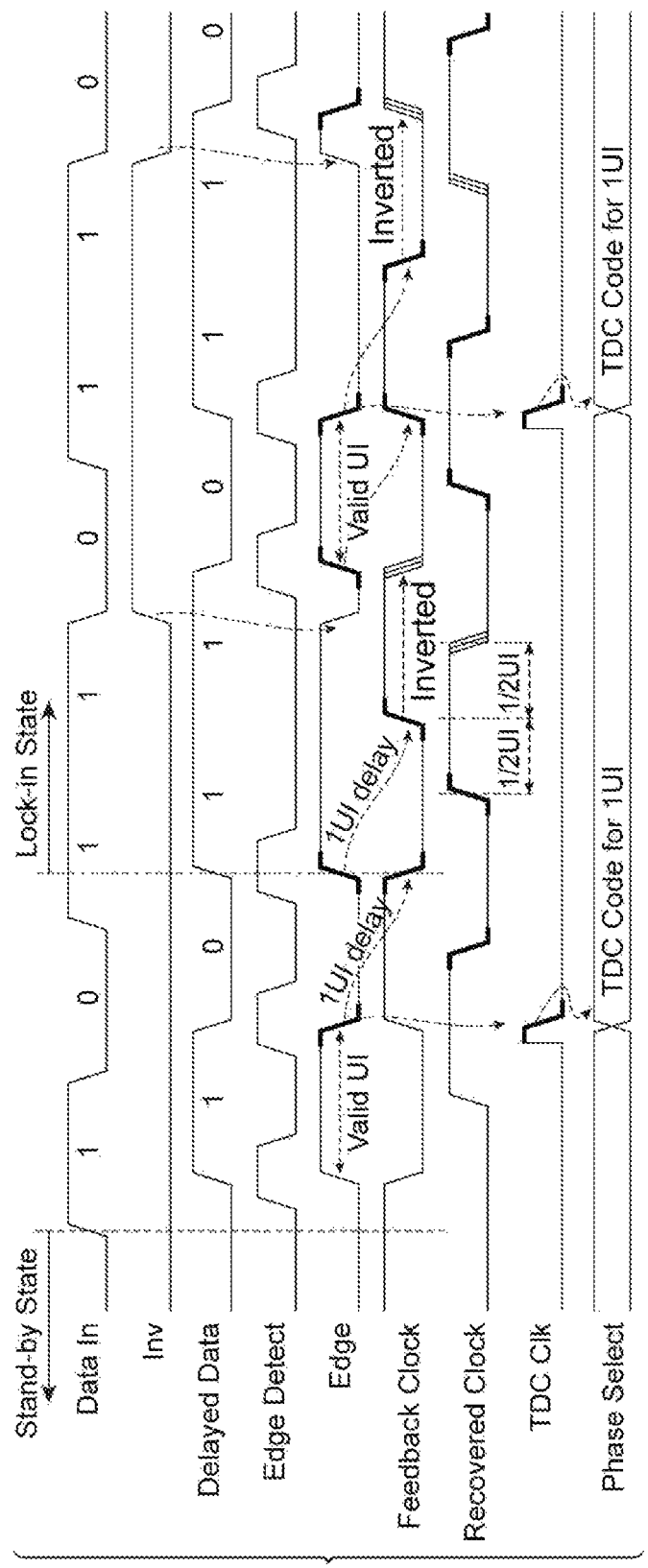
FIG. 13 is a timing chart of each signal in the clock data recovering apparatus 1 according to the first embodiment.

FIG. 13 is a timing chart of each signal in the clock data recovering apparatus 1 according to the first embodiment. FIG. 13 illustrates the input signal (Data. In), the logic inversion indication signal (INV), the delayed input signal (Delayed Data), the edge detection signal (Edge Detect), the edge signal (Edge), the feedback clock (Feedback Clock), the recovered clock (Recovered Clock), the signal (TDC Clk) indicating the timing of the latch operation, and the signal (Phase Select) showing the unit interval time measured by the time measurement unit 30 and given to the phase selection unit 40. In addition, FIG. 13 illustrates a period in which a preamble and normal data are input as the input signal.

When 2-bit data [10] of the preamble is input, the clock data recovering apparatus 1 enters a lock state and can obtain a recovered clock and recovered data on the basis of the normal data input following the preamble. As described using FIG. 9, when there is an edge in the input signal, the clock data recovering apparatus 1 causes the edge to be input to the phase delay unit 20, so that the clock data recovering apparatus 1 can match a phase of the recovered clock (Recovered Clock) with a phase of the input signal.

When there is 3-bit data [010] in the signal (Edge in) outputted from the signal selection unit 10 at the time of transmitting the normal data (Normal Data), the clock data recovering apparatus 1 measures the unit interval time by the time measurement unit 30 and adjusts a clock oscillation frequency on the basis of the measured unit interval time. As a result, even when a characteristic of each delay element of the phase delay unit 20 is changed by a change of a temperature/voltage during an operation or a bit rate of the input signal changes slowly, recovery operations of the clock and the data can be executed normally.

In the operation example described above, because the frequency of each of the feedback clock (Feedback Clock) and the recovered clock (Recovered Clock) is determined by the position of the delay element selected by the phase selection unit 40 among the P delay elements $21_1$ to $21_P$ of the phase delay unit 20, the frequency is only one value selected from a plurality of discrete values. For this reason, the frequency of the clock and the bit rate of the input signal may not be matched with each other. As a result, CID resistance may be bad. The clock generating apparatus 1A according to this embodiment includes the phase detection unit 13 and the phase control unit 14 to deal with the problems.

The phase detection unit 13 detects a phase relation between the edge signal (Edge) and the feedback clock (Feedback Clock). The phase control unit 14 generates a control signal to control a signal selection operation by the phase selection unit 40 such that the phase difference detected by the phase detection unit 13 decreases and gives the control signal to the phase selection unit 40. As a result, in the phase selection unit 40, the N-th delay element $21_N$ and the (N+1)-th delay element $21_{N+1}$ among the P delay elements $21_1$ to $21_P$ of the phase delay unit 20 are selected at a certain ratio $(1-\alpha):\alpha$ and this is the same as that a (N+$\alpha$)-th delay element is selected effectively. In addition, N is an integer and $\alpha$ (alpha) is a decimal between 0 and 1.

Figure 14:
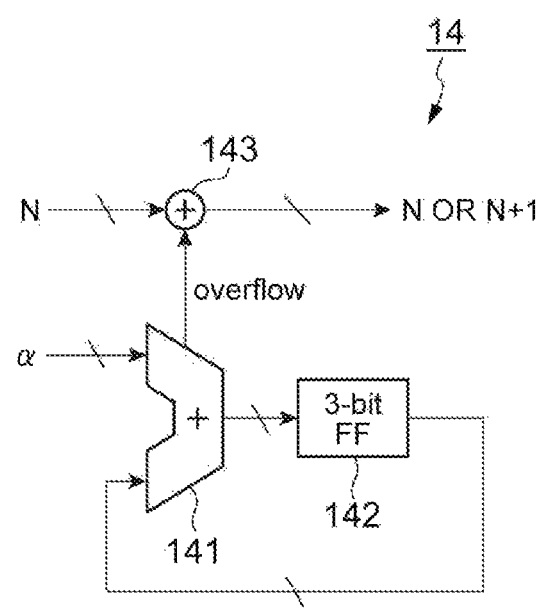
FIG. 14 is a diagram illustrating a configuration example of a phase control unit 14.

FIG. 14 is a diagram illustrating a configuration example of the phase control unit 14. The phase control unit 14 has a configuration of a $\Delta\Sigma$ modulator including an accumulator 141, a latch unit 142, and an adder 143. These elements operate in synchronization with the feedback clock (Feedback Clock). Here, it is assumed that these elements handle 3-bit data. The accumulator 141 receives the 3-bit data latched and output by the latch unit 142, receives the 3-bit data showing $\alpha$, and adds the input two 3-bit data. In addition, the accumulator 141 outputs lower 3-bit data in an addition result to the latch unit 142. When overflow occurs at the time of addition, the accumulator 141 and outputs a value 1 to the adder 143. The latch unit 142 receives the 3-bit data outputted from the accumulator 141 and latches the 3-bit data.

The adder 143 receives data showing a value N and receives data showing a value 1, when the overflow occurs at the time of the addition in the accumulator 141. The probability that the overflow occurs at the time of the addition in the accumulator 141 is $\alpha$. Therefore, data outputted from the adder 143 shows the value N at the probability $(1-\alpha)$ and shows the value (N+1) at the probability $\alpha$. For example, in the case of $\alpha=0.25$, the overflow occurs at the time of the addition in the accumulator 141, at a ratio of ¼. Therefore, the data outputted from the adder 143 shows the value N at a ratio of ¾ and shows the value (N+1) at a ratio of ¼.

The phase control unit 14 generates a control signal to control a signal selection operation by the phase selection unit 40, on the basis of the data outputted from the adder 143, and gives the control signal to the phase selection unit 40. As a result, in the phase selection unit 40, the N-th delay element $21_N$ and the (N+1)-th delay element $21_{N+1}$ among the P delay elements $21_1$ to $21_P$ of the phase delay unit 20 are selected at a ratio $(1-\alpha):\alpha$ and this is the same as that a (N+$\alpha$)-th delay element is selected effectively.

In addition, the configuration of the phase control unit 14 is not limited to the configuration illustrated in FIG. 14 and other aspect is also enabled. The phase control unit 14 may have a configuration including a filter and may have a configuration including a $\Delta\Sigma$ modulator and a filter. In addition, the filter may have a configuration including both a low-pass filter and an accumulator or any one of the low-pass filter and the accumulator.

Figure 15:
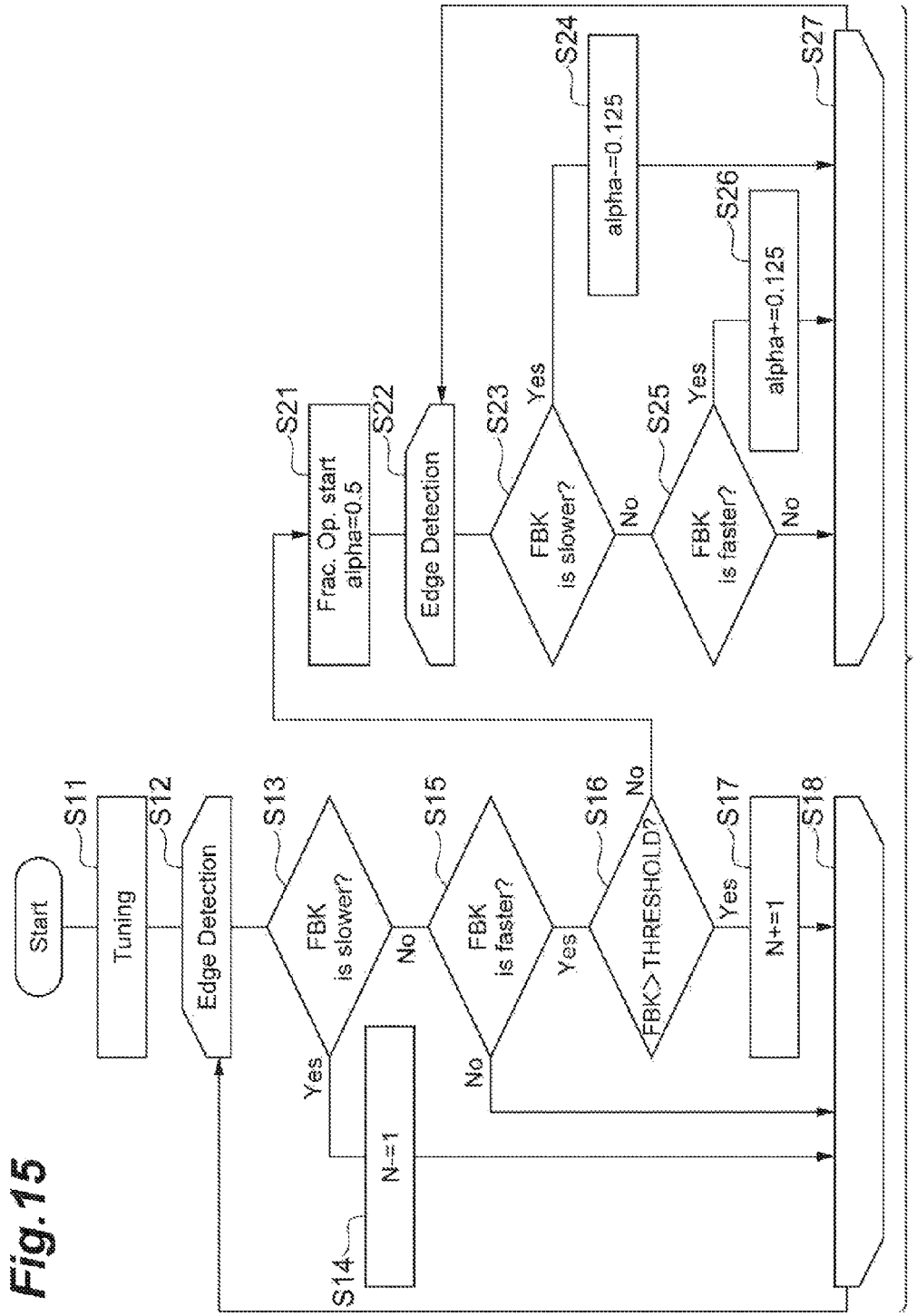
FIG. 15 is a flowchart illustrating an example of an α (alpha) determination method in the phase control unit 14.

FIG. 15 is a flowchart illustrating an example of an $\alpha$ (alpha) determination method in the phase control unit 14. First, the unit interval time is measured by the time measurement unit 30 on the basis of the data of the preamble and the N-th delay element $21_N$ among the P delay elements $21_1$ to $21_P$ of the phase delay unit 20 is selected by the phase selection unit 40 on the basis of the measured unit interval time (step S11). As a result, a state becomes a lock state and the recovered clock and the recovered data are obtained on the basis of the normal data following the preamble.

If an edge appears in the input signal (step S12), a phase relation between the edge signal (Edge) and the feedback clock (Feedback Clock) is detected by the phase detection unit 13. If a phase (FINK) of the feedback clock is slower than a phase of the edge signal (Yes in step S13), a value 1 is subtracted from N and N is newly set (step S14). If the phase of the feedback clock is faster than the phase of the edge signal (Yes in step S15) and a phase difference (described as "FBK" in FIG. 15) is larger than a threshold (Yes in step S16), a value 1 is added to N and N is newly set (step S17). After N is updated, the process returns to step S12 (step S18). A repetitive process of steps S12 to S18 is executed to optimize N when N immediately after the lock is not appropriate due to an influence of jitter superimposed on the preamble.

If the phase of the feedback clock is faster than the phase of the edge signal (No in step S15) and the phase difference is equal to or smaller than the threshold (No in step S16), the process proceeds to step S21 and α is determined. First, α=0.5 is set as an initial value (step S21). If the edge appears in the input signal (step S22), a phase relation between the edge signal (Edge) and the feedback clock (Feedback Clock) is detected by the phase detection unit 13. If the phase of the feedback clock is slower than the phase of the edge signal (Yes in step S23), a value 0.125 is subtracted from a and a is newly set (step S24). If the phase of the feedback clock is faster than the phase of the edge signal (Yes in step S25), a value 0.125 is added to α and α is newly set (step S26). After a is updated, the process returns to step S22 (step S27). In this way, a is determined. Determined α is input to the accumulator 141 of the phase control unit 14 illustrated in FIG. 14.

As described above, in the clock data recovering apparatus 1 and the clock generating apparatus 1A according to the first embodiment, a PLL is unnecessary and a circuit to generate a reference clock is also unnecessary. Therefore, a circuit scale can be reduced and a manufacturing cost can be reduced. In addition, the clock data recovering apparatus 1 and the clock generating apparatus 1A according to the first embodiment can reduce the consumption power in the standby period in which a signal is not input. In addition, the clock data recovering apparatus 1 according to the first embodiment can start to recover the clock and the data in a short time after the signal input starts. In addition, in this embodiment, the clock frequency is not limited to one value (a frequency according to the position N of the selected delay element $21_N$) selected from the plurality of discrete values and can be set as a frequency according to a value between N and N+1 effectively. Therefore, CID resistance can be improved.

Second Embodiment

Figure 16:
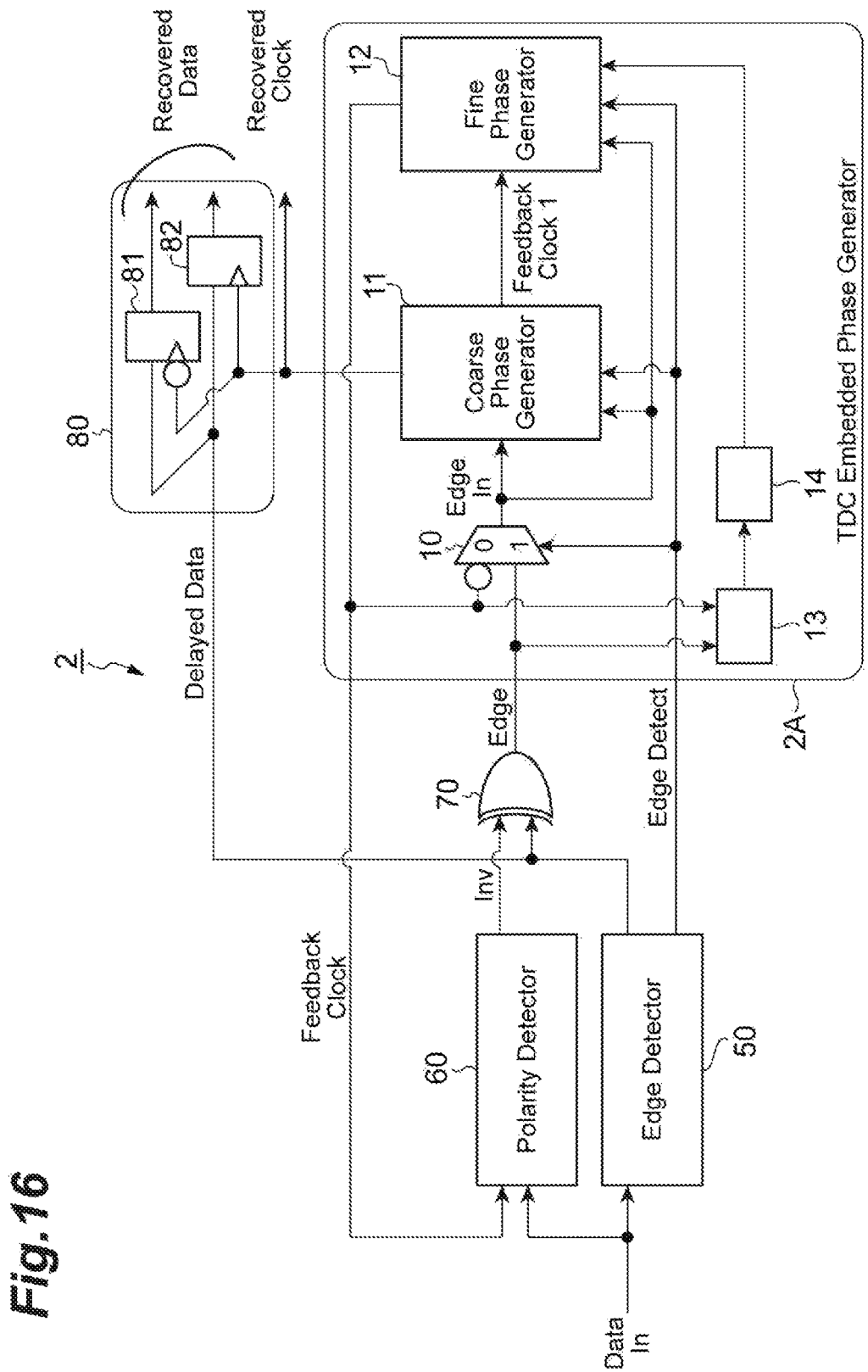
FIG. 16 is a diagram illustrating a configuration of a clock data recovering apparatus 2 according to a second embodiment.

FIG. 16 is a diagram illustrating a configuration of a clock data recovering apparatus 2 according to a second embodiment. A configuration of the clock data recovering apparatus 2 according to the second embodiment is the same as the configuration of the clock data recovering apparatus 1 according to the first embodiment illustrated in FIG. 1 in that the clock data recovering apparatus 2 includes an edge detection unit 50, a polarity detection unit 60, a logic inversion unit 70, and a data output unit 80. However, the configuration of the clock data recovering apparatus 2 according to the second embodiment is different from the configuration of the clock data recovering apparatus 1 according to the first embodiment in that the clock data recovering apparatus 2 includes a clock generating apparatus (corresponding to a "TDC Embedded Phase Generator" of FIG. 16) 2A, instead of the clock generating apparatus 1A. The clock generating apparatus 2A includes a signal selection unit 10, a phase detection unit 13, and a phase control unit 14 equal to those in the first embodiment, a coarse phase adjustment unit (corresponding to a "Coarse Phase Generator" of FIG. 16) 11 to coarsely adjust a phase of a feedback clock, and a fine phase adjustment unit (corresponding to a "Fine Phase Generator" of FIG. 16) 12 to finely adjust the phase of the feedback clock.

Figure 17:
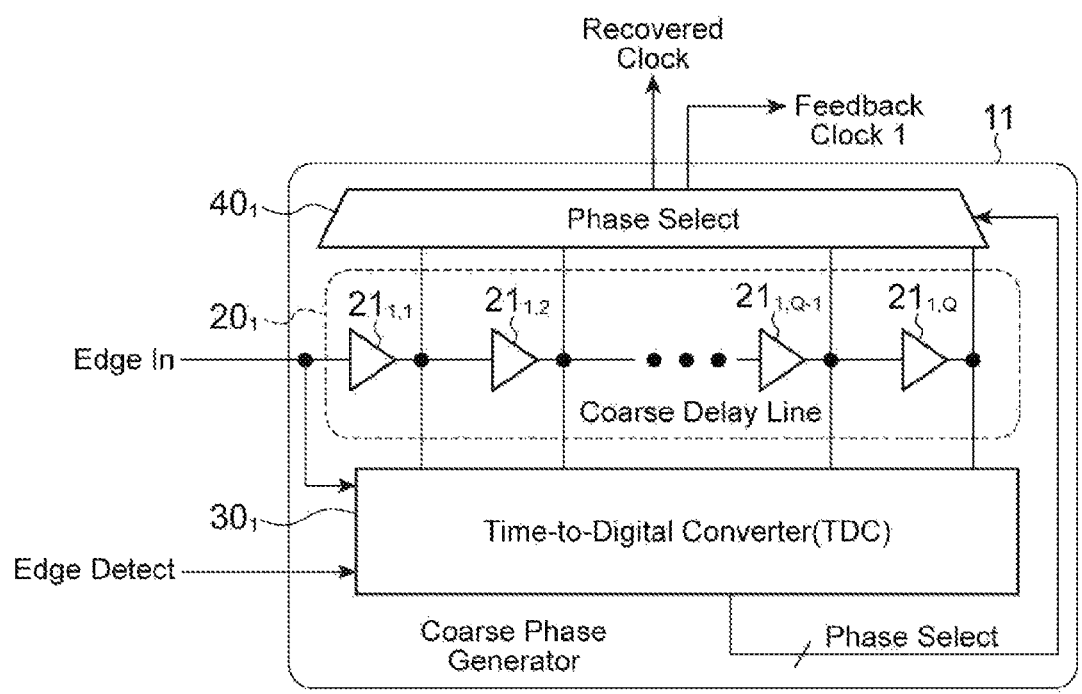
FIG. 17 is a diagram illustrating a configuration of a coarse phase adjustment unit 11.
Figure 18:
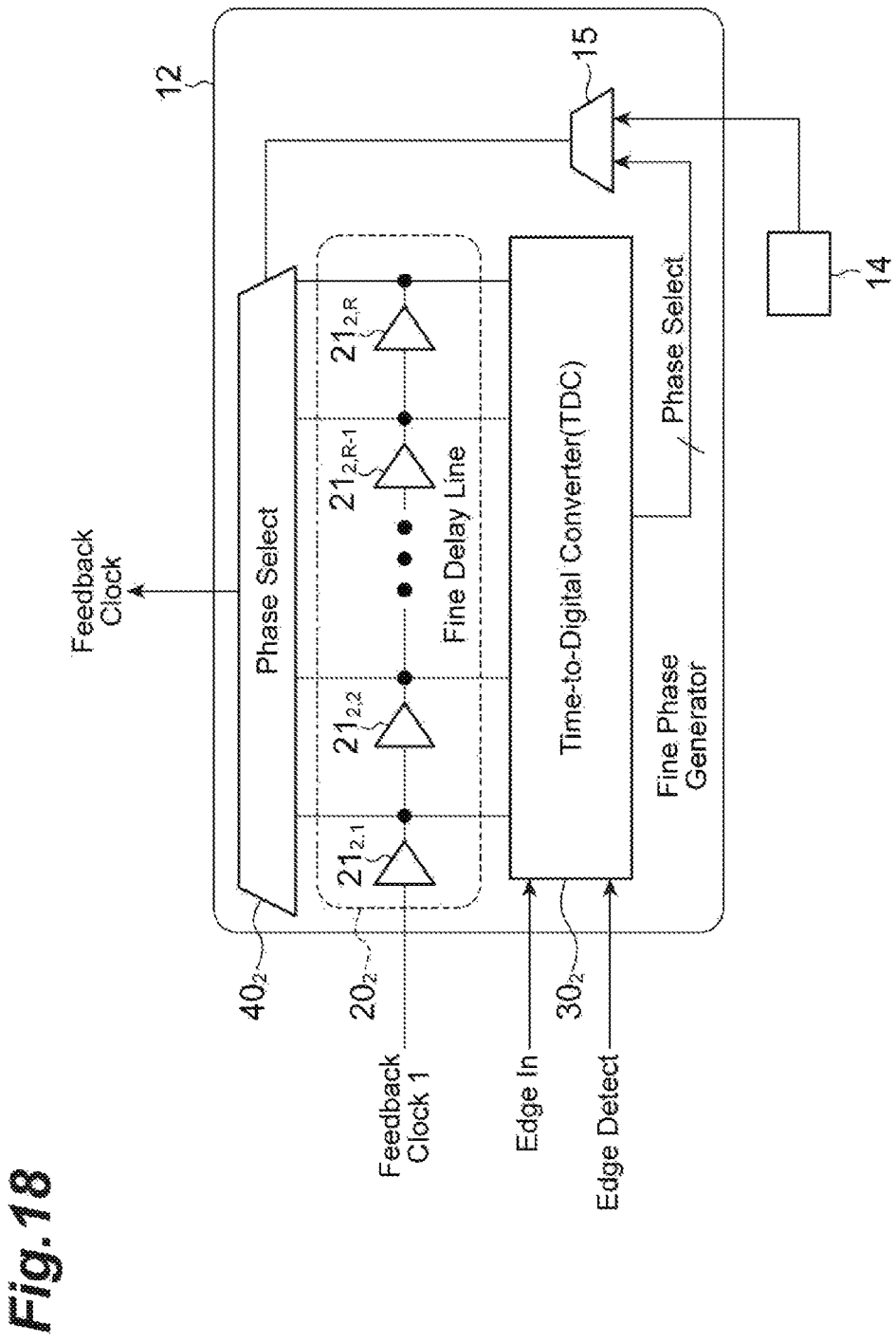
FIG. 18 is a diagram illustrating a configuration of a fine phase adjustment unit 12.

FIG. 17 is a diagram illustrating a configuration of the coarse phase adjustment unit 11. The coarse phase adjustment unit 11 includes a phase delay unit (corresponding to a "Coarse Delay Line" of FIG. 17) $20_1$, a time measurement unit (corresponding to a "Time-to-Digital converter (TDC)" of FIG. 17) $30_1$, and a phase selection unit (corresponding to "Phase Select" of FIG. 17) $40_1$. The phase delay unit $20_1$ includes a plurality of (Q) delay elements $21_{1,1}$ to $21_{1,Q}$ connected in cascade, similar to the phase delay unit 20 in the first embodiment. Among the plurality of delay elements $21_{1,1}$ to $21_{1,Q}$, the delay element $21_{1,1}$ of an initial step receives a signal (Edge In) outputted from the signal selection unit 10. The time measurement unit $30_1$ measures a unit interval time on the basis of a level of a signal outputted from each of the delay elements $21_{1,1}$ to $21_{1,Q}$ of the phase delay unit $20_1$, similar to the time measurement unit 30 in the first embodiment. The phase selection unit $40_1$ selects a signal outputted from a delay element at a position corresponding to the unit interval time measured by the time measurement unit $30_1$ among the delay elements $21_{1,1}$ to $21_{1,Q}$ of the phase delay unit $20_1$ and outputs the selected signal as a feedback clock (Feedback Clock 11) to the fine phase adjustment unit 12, similar to the phase selection unit 40 in the first embodiment FIG. 18 is a diagram illustrating a configuration of the fine phase adjustment unit 12. The fine phase adjustment unit 12 includes a phase delay unit (corresponding to a "Coarse Delay Line" of FIG. 18) $20_2$, a time measurement unit (corresponding to a "Time-to-Digital converter (IDC)" of FIG. 18) $30_2$, a phase selection unit (corresponding to "Phase Select" of FIG. 18) $40_2$, and a selection unit 15. The phase delay unit $20_2$ includes a plurality of (R) delay elements $21_{2,1}$ to $21_{2,R}$ connected in cascade, similar to the phase delay unit 20 in the first embodiment. Among the plurality of delay elements $21_{2,1}$ to $21_{2,R}$, the delay element $21_{2,1}$ of an initial step receives the feedback clock (Feedback Clock 1) outputted from the phase selection unit $40_1$ of the coarse phase adjustment unit 11. The time measurement unit $30_2$ measures a unit interval time on the basis of a level of a signal outputted from each of the delay elements $21_{2,1}$ to $21_{2,R}$ of the phase delay unit $20_2$, similar to the time measurement unit 30 in the first embodiment. The phase selection unit $40_2$ selects a signal outputted from a delay element at a position corresponding to the unit interval time measured by the time measurement unit $30_2$ among the delay elements $21_{2,1}$ to $21_{2,R}$ of the phase delay unit $20_2$ and outputs the selected signal as a feedback clock (Feedback Clock) to the signal selection unit 10 and the polarity detection unit 60, similar to the phase selection unit 40 in the first embodiment. The selection unit 15 selects any one of R-bit digital data showing a unit interval time measurement result outputted from the time measurement unit $30_2$ and a control signal outputted from the phase control unit 14 and gives it to the phase selection unit $40_2$.

The signal selection unit 10 receives the feedback clock outputted from the phase selection unit $40_2$ of the fine phase adjustment unit 12. The phase delay unit $20_1$ of the coarse phase adjustment unit 11 inputs a signal outputted from the signal selection unit 10 to the delay element $21_{1,1}$ of the initial step. The phase delay unit $20_2$ of the fine phase adjustment unit 12 inputs the feedback clock outputted from the phase selection unit $40_1$ of the coarse phase adjustment unit 11 to the delay element $21_{2,1}$ of the initial step. As a result, a return route for the feedback clock is configured.

A period of the feedback clock is determined according to a sum of a delayed time coarsely adjusted by the phase delay unit $20_1$ of the coarse phase adjustment unit 11 and a delayed time finely adjusted by the phase delay unit $20_2$ of the fine phase adjustment unit 12. A delayed time of each delay element of the phase delay unit $20_1$ of the coarse phase adjustment unit 11 is longer than a delayed time of each delay element of the phase delay unit $20_2$ of the fine phase adjustment unit 12. As a result, the coarse phase adjustment unit 11 can coarsely adjust a phase of the feedback clock and the fine phase adjustment unit 12 can finely adjust the phase of the feedback clock. The delayed time in the phase delay unit $20_1$ of the coarse phase adjustment unit 11 may be set to be slightly shorter than the unit interval time (to be shorter than the unit interval time by a delayed time of several delay elements) and a difference thereof may be finely adjusted as the delayed time in the phase delay unit $20_2$ of the fine phase adjustment unit 12.

The phase selection unit $40_1$ of the coarse phase adjustment unit 11 selects a signal outputted from any delay element among the delay elements $21_{1,1}$ to $21_{1,Q}$ of the phase delay unit $20_1$ and outputs the signal as a recovered clock (Recovered Clock) of a frequency corresponding to a bit rate of an edge signal to the data output unit 80.

Figure 19:
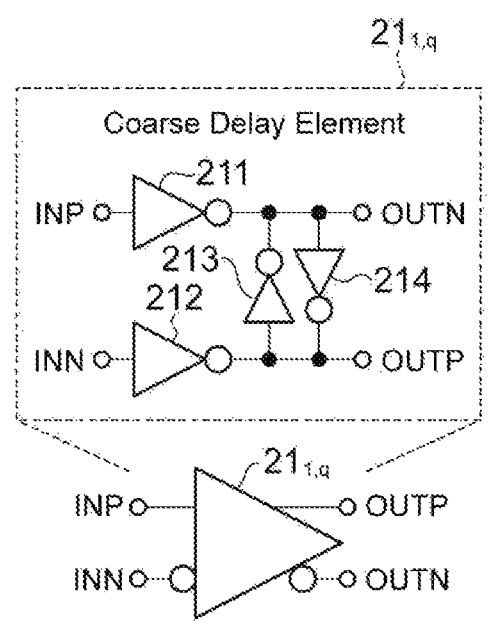
FIG. 19 is a diagram illustrating a circuit configuration example of each delay element $21_{1,q}$ of a phase delay unit $20_1$ of the coarse phase adjustment unit 11.
Figure 20:
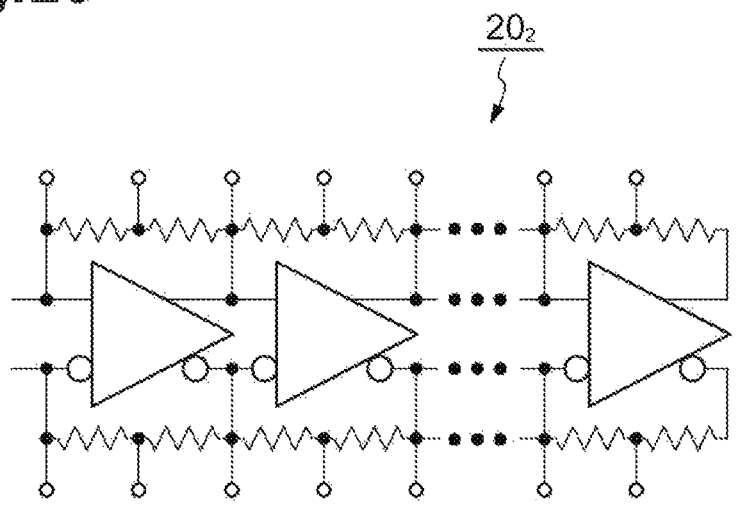
FIG. 20 is a diagram illustrating a circuit configuration example of each delay element $21_{2,r}$ of a phase delay unit $20_2$ of the fine phase adjustment unit 12.

FIG. 19 is a diagram illustrating a circuit configuration example of each delay element (corresponding to a "Coarse Delay Element" of FIG. 19) $21_{1,q}$ of the phase delay unit $20_1$ of the coarse phase adjustment unit 11. FIG. 20 is a diagram illustrating a circuit configuration example of each delay element $21_{2,r}$ of the phase delay unit $20_2$ of the fine phase adjustment unit 12. In FIGS. 19 and 20, circuit configurations in which each delay element inputs and outputs a differential signal are illustrated.

Each delay element $21_{1,q}$ of the phase delay unit $20_1$ of the coarse phase adjustment unit 11 illustrated in FIG. 19 includes two input terminals INP and INN to input a differential signal, two output terminals OUTP and WIN to output the differential signal, and INV circuits 211 to 214. The INV circuit 211 logically inverts a signal input to the input terminal INP and outputs the signal to the output terminal OUTN. The INV circuit 212 logically inverts a signal input to the input terminal INN and outputs the signal to the output terminal OUTP. An input terminal of the INV circuit 213 is connected to the output terminal OUTP and an output terminal of the INV circuit 213 is connected to the output terminal OUTN. An input terminal of the INV circuit 214 is connected to the output terminal WIN and an output terminal of the INV circuit 214 is connected to the output terminal OUTP. The phase delay unit $20_2$ of the fine phase adjustment unit 12 illustrated in FIG. 20 is configured by connecting unit circuits illustrated in FIG. 19 in cascade and providing resistor strings to connect input/output terminals of the unit circuits.

For example, the delayed time of each delay element $21_{1,q}$ of the coarse phase adjustment unit 11 can be set as about 35 ps and the delayed time of each delay element $21_{2,r}$ of the time phase adjustment unit 12 can be set as about 6 ps. In addition, the number Q of delay elements of the coarse phase adjustment unit 11 can be set as 18 and the number R of delay elements of the fine phase adjustment unit 12 can be set as 12.

Figure 21:
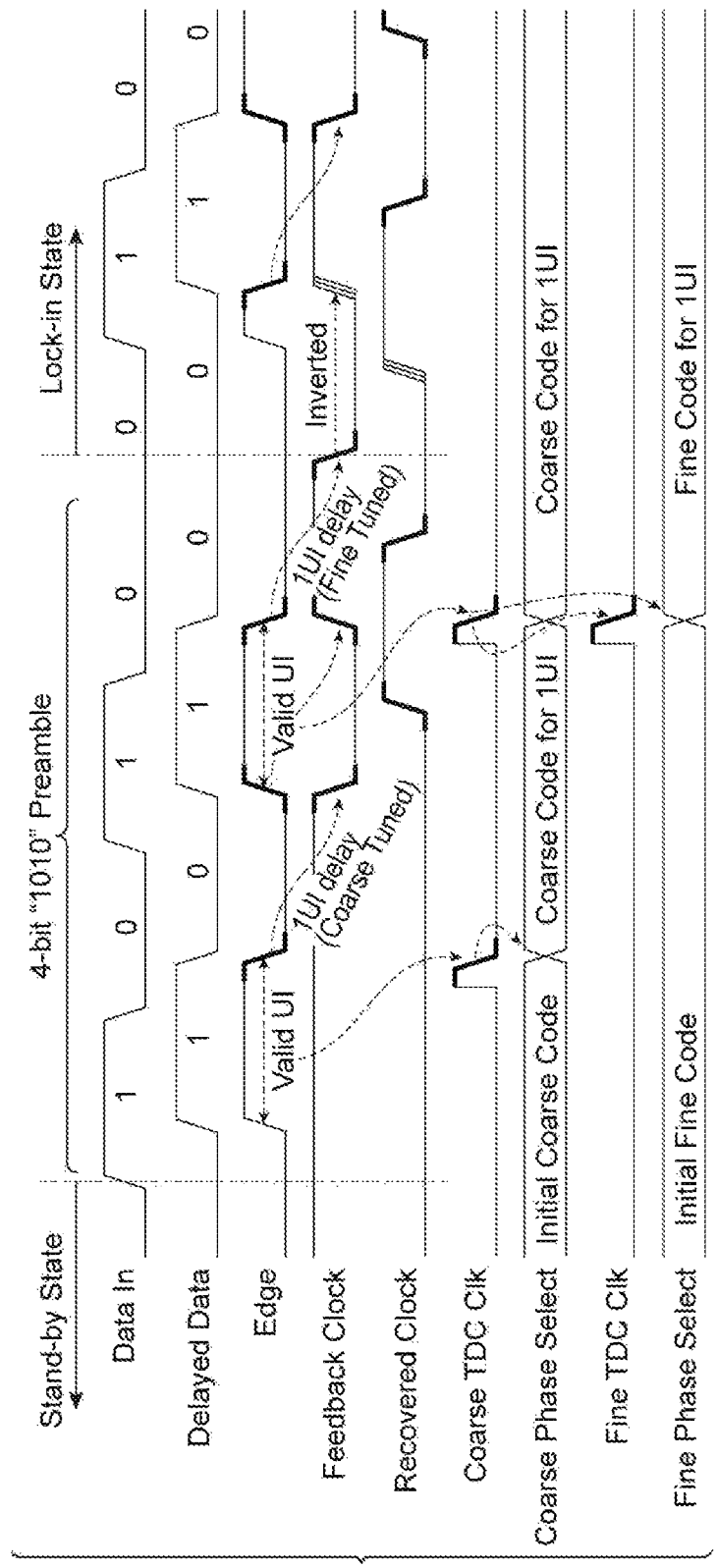
FIG. 21 is a timing chart of each signal in the clock data recovering apparatus 2 according to the second embodiment.

FIG. 21 is a timing chart of each signal in the clock data recovering apparatus 2 according to the second embodiment. FIG. 21 illustrates an input signal (Data. In), a delayed input signal (Delayed Data), an edge signal (Edge), a feedback clock: (Feedback Clock) outputted from the phase selection unit $40_2$ of the fine phase adjustment unit 12, a recovered clock (Recovered. Clock), a signal (Coarse TDC Clk) indicating timing of a latch operation of the time measurement unit $30_1$ of the coarse phase adjustment unit 11, a signal (Coarse Phase Select) showing a unit interval time measured by the time measurement unit $30_1$ of the coarse phase adjustment unit 11 and given to the phase selection unit $40_1$, a signal (Fine TDC Clk) indicating timing of a latch operation of the time measurement unit $30_2$ of the fine phase adjustment unit 12, and a signal (Fine Phase Select) showing a unit interval time measured by the time measurement unit $30_2$ of the fine phase adjustment unit 12 and given to the phase selection unit $40_2$. In addition, FIG. 21 illustrates a period in which a preamble and normal data are input as an input signal.

When 4-bit data [1010] of the preamble is input, the clock data recovering apparatus 2 enters a lock state and can obtain a recovered clock and recovered data on the basis of the normal data following the preamble. At this time, a delayed amount of the phase delay unit $20_1$ of the coarse phase adjustment unit 11 is set by a first falling edge of the preamble and a delayed amount of the phase delay unit $20_2$ of the fine phase adjustment unit 12 is set by a second falling edge of the preamble. When there is an edge in the input signal, the clock data recovering apparatus 2 causes the edge to be input to the phase delay units $20_1$ and $20_2$, so that the clock data recovering apparatus 2 can match a phase of the recovered clock (Recovered Clock) with a phase of the input signal.

When there is 3-bit data [010] in the normal data (Normal Data), the clock data recovering apparatus 2 measures the unit interval time by the time measurement units $30_1$ and $30_2$ and adjusts a clock oscillation frequency on the basis of the measured unit interval time. As a result, even when a characteristic of each delay element of the phase delay units $20_1$ and $20_2$ is changed by a change of a temperature/voltage during an operation or a bit rate of the input signal changes slowly, recovery operations of the clock and the data can be executed normally.

The phase control unit 14 may control a signal selection operation of any one of the phase selection units $40_1$ and $40_2$. However, the phase control unit 14 preferably controls the signal selection operation of the phase selection unit $40_2$ of the fine phase adjustment unit 12 rather than the phase selection unit $40_1$ of the coarse phase adjustment unit 11. A clock frequency can be adjusted more finely by controlling the signal selection operation of the phase selection unit $40_2$ of the fine phase adjustment unit 12.

As described above, in the clock data recovering apparatus 2 and the clock generating apparatus 2A according to the second embodiment, a PLL is unnecessary and a circuit to generate a reference clock is also unnecessary. Therefore, a circuit scale can be reduced and a manufacturing cost can be reduced. In addition, the clock data recovering apparatus 2 and the clock generating apparatus 2A according to the second embodiment can reduce consumption power in a standby period in which a signal is not input, in addition, the clock data recovering apparatus 2 according to the second embodiment can start to recover the clock and the data in short time after the signal input starts. In addition, in this embodiment, the clock frequency is not limited to one value (a frequency according to the position N of the selected delay element $21_{2,N}$) selected from a plurality of discrete values and can be set as a frequency according to a value between N and N+1 effectively. Therefore, CID resistance can be improved.

The clock generating apparatus 2A according to the second embodiment has the following advantages as compared with the clock generating apparatus 1A according to the first embodiment.

In the clock generating apparatus 1A according to the first embodiment, because an operation is executed like the ring oscillator when the edge detection signal (Edge Detect) is at a non-significant level, a total delayed time applied to the feedback clock in the phase delay unit 20 is preferably equal to the unit interval time of the input signal (Data In). To realize this, the delayed amount in each delay element 21 of the phase delay unit 20 is preferably small. For this reason, the number P of delay elements 21 of the phase delay unit 20 tends to increase. For example, if an operation frequency is set to ½, the number P of delay elements 21 of the phase delay unit 20 doubles and the number P of flip-flops 31 of the time measurement unit 30 also doubles. In addition, if the operation frequency is set to ¼, the number P of delay elements 21 of the phase delay unit 20 quadruples and the number P of flip-flops 31 of the time measurement unit 30 also quadruples. As such, when the clock generating apparatus 1A according to the first embodiment precisely sets a clock oscillation frequency at the time of operating like the ring oscillator, consumption power as well as a circuit area increases and a wide range of the operation frequency is limited.

Meanwhile, in the clock generating apparatus 2A according to the second embodiment, the delayed time in the coarse phase adjustment unit 11 including the phase delay unit $20_1$, the time measurement unit $30_1$, and the phase selection unit $40_1$ is set to become coarsely equal to the unit interval time of the input signal (Data In) and the delayed amount in the fine phase adjustment unit 12 including the phase delay unit $20_2$, the time measurement unit $30_2$, and the phase selection unit $40_2$ can be finely adjusted. Therefore, in the clock generating apparatus 2A according to the second embodiment, the number (Q+R) of delay elements of the phase delay units $20_1$ and $20_2$ and the number (Q+R) of flip-flops of the time measurement units $30_1$ and $30_2$ can be avoided from increasing and both preciseness of the clock oscillation frequency and a wide range of the operation frequency can be realized while a circuit area and consumption power are avoided from increasing.

In the second embodiment described above, the configuration of the two steps including the coarse phase adjustment unit 11 (the phase delay unit $20_1$, the time measurement unit $30_1$, and the phase selection unit $40_1$) and the fine phase adjustment unit 12 (the phase delay unit $20_2$, the time measurement unit $30_2$, and the phase selection unit $40_2$) is used.

However, a configuration of three steps or more may be used. In the case of the configuration of the three steps or more, the phase control unit 14 may control a signal selection operation of a phase selection unit of any step. However, the phase control unit 14 preferably controls a signal selection operation of a phase selection unit of a step capable of setting delay most precisely.

Other Embodiment

Figure 22A:
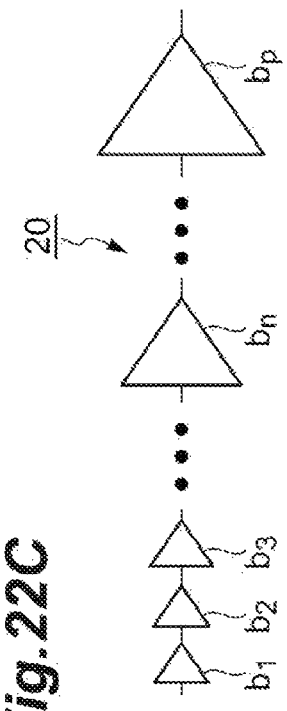
FIGS. 22A to 22D are diagrams illustrating delayed times of a plurality of delay elements connected in cascade in a phase delay unit 20.
Figure 22B:
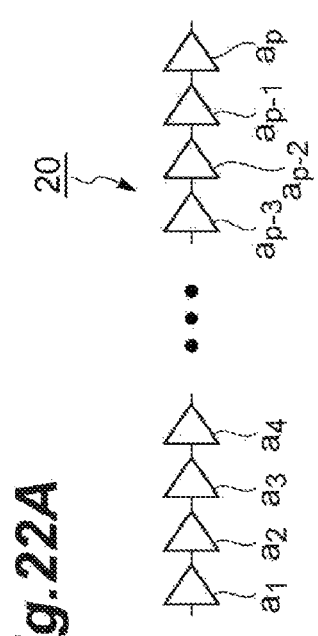
Figure 22C:
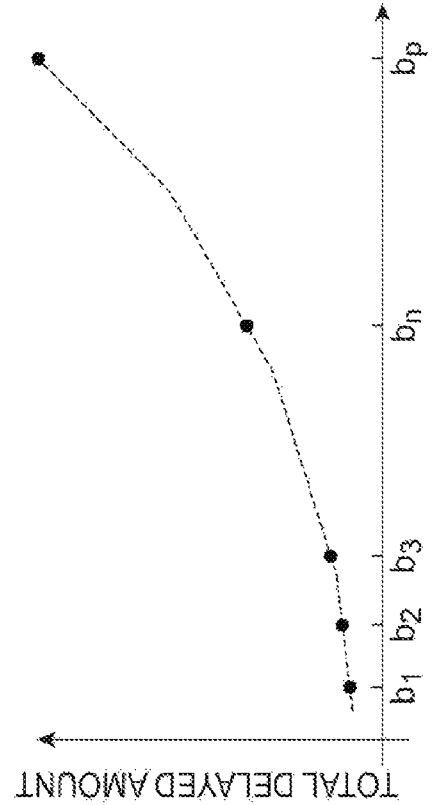
Figure 22D:
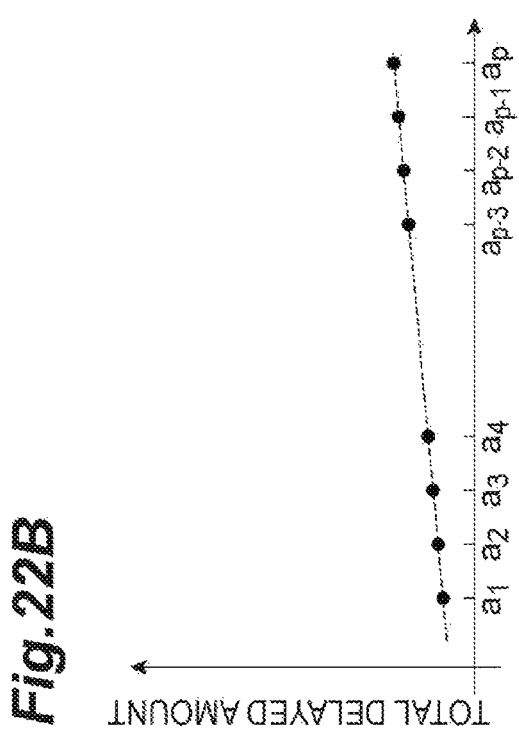

The present invention is not limited to the embodiments described above and various modifications can be made. For example, each of the phase delay units 20, and 20, may have a structure in which a plurality of delay elements $a_1$, $a_2$, $a_3$, $a_4$, . . . , $a_{p-3}$, $a_{p-2}$, $a_{p-1}$, and $a_p$ where delayed times are constant are connected in cascade, as illustrated in FIG. 22A. FIG. 22B illustrates a total delayed time of signals outputted from the delay elements $a_1$, $a_2$, $a_3$, $a_4$, . . . , $a_{p-3}$, $a_{p-2}$, $a_{p-1}$, and $a_p$, respectively. Meanwhile, each of the phase delay units 20, $20_1$, and $20_2$ preferably has a structure in which a plurality of delay elements $b_2$, $b_3$, . . . , $b_n$, . . . , and $b_p$ where delayed times are set long at a rear step side rather than a front step side are connected in cascade, as illustrated in FIG. 22C. FIG. 22D illustrates a total delayed time of signals outputted from the delay elements $b_1$, $b_2$, $b_3$, . . . , $b_n$, . . . , and $b_p$, respectively. In examples of FIGS. 22C and 22D, the delayed time of each delay element is preferably set to increase logarithmically with respect to a position of each delay element. When an operation frequency is slow, a large amount of delay elements are used and precision is high. For this reason, if the delayed time is set long in the delay element of the rear step, the number of delay elements of the phase delay unit 20 and the number of flip-flops of the time measurement unit 30 can be avoided from increasing and both preciseness of the clock oscillation frequency and a wide range of the operation frequency can be realized while a circuit area and consumption power are avoided from increasing.

Figure 23:
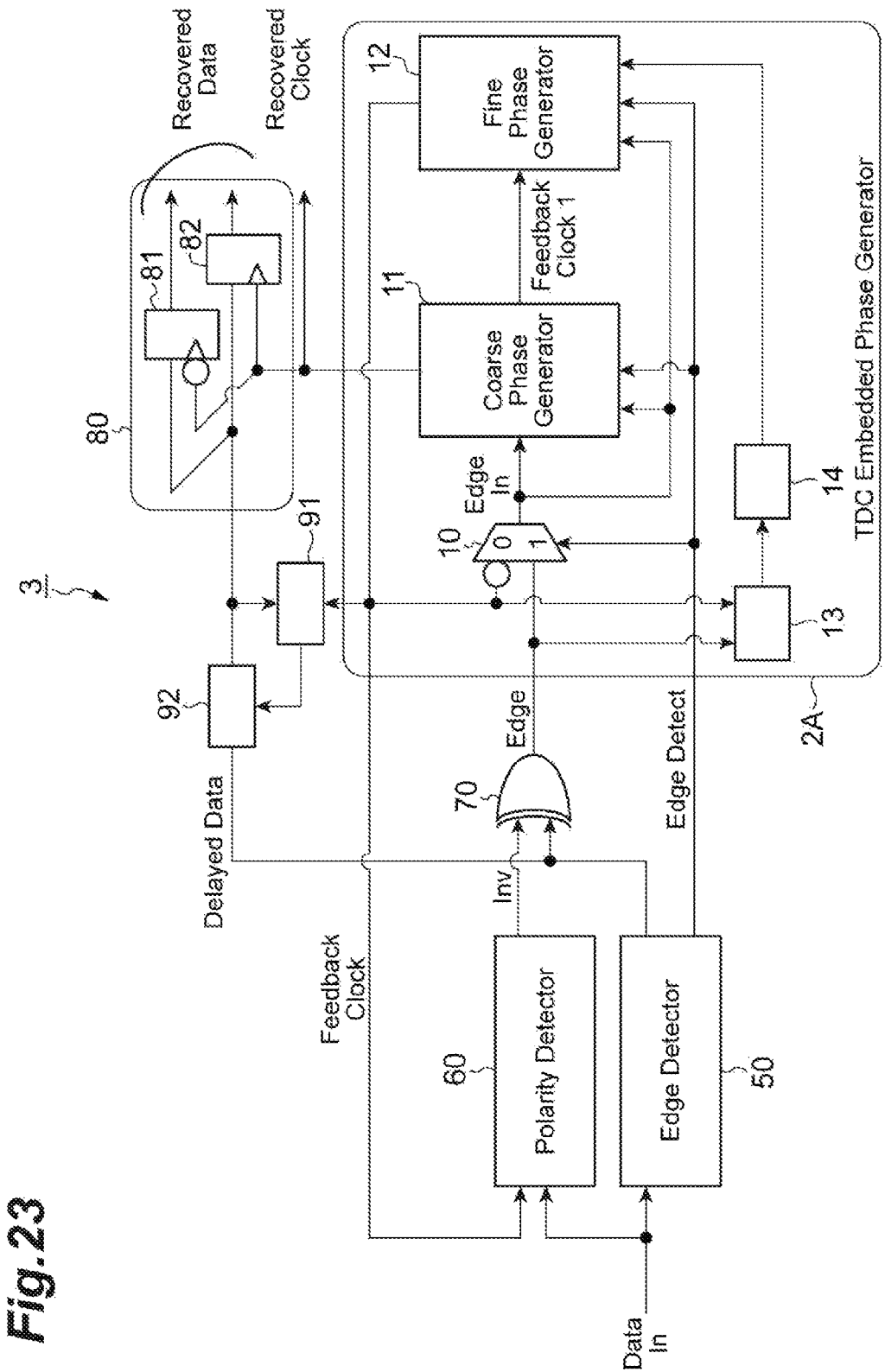
FIG. 23 is a diagram illustrating a configuration of a clock data recovering apparatus 3 according to other embodiment.

In addition, in the present invention, an embodiment illustrated in FIG. 23 is also enabled. FIG. 23 is a diagram illustrating a configuration of a clock data recovering apparatus 3 according to other embodiment. A configuration of the clock data recovering apparatus 3 illustrated in FIG. 23 is different from the configuration of the clock data recovering apparatus 2 according to the second embodiment illustrated in FIG. 16 in that the clock data recovering apparatus 3 further includes an input signal phase detection unit 91 and an input signal phase adjustment unit 92. Therefore, the configuration of the clock data recovering apparatus 3 of FIG. 23 other than the input signal phase detection unit 91 and the input signal phase adjustment unit 92 is matched with the configuration of the clock data recovering apparatus 2 of FIG. 16.

The input signal phase detection unit 91 detects a phase relation between a feedback clock (Feedback Clock) and a delayed input signal (Delayed Data). The input signal phase detection unit 91 latches the delayed input signal by the feedback clock and a plurality of clocks of which phases are different from a phase of the feedback clock by constant amounts and detects the phase relation between the feedback clock and the delayed input signal, on the basis of levels of three or more data obtained by the latch. The input signal phase adjustment unit 92 adjusts the phase of the delayed input signal (Delayed Data) input to a data output unit 80, on the basis of a detection result by the input signal phase detection unit 91, such that a phase difference of the individual signals decreases.

By this configuration, the phase relation between the delayed input signal (Delayed Data) input to the data output unit 80 and the feedback clock (Feedback Clock) can be optimized (a state in which edge timings are matched) and a phase relation between the delayed input signal (Delayed Data) input to the data output unit 80 and a recovered clock (Recovered Clock) can be optimized. Therefore, in the data output unit 80, an edge of the recovered clock (Recovered Clock can be caused to exist at a center time of data of each bit of the delayed input signal (Delayed Data). As a result, jitter resistance or CID resistance can be improved.

Even in the configuration of the first embodiment illustrated in FIGS. 1 and 2, the input signal phase detection unit 91 and the input signal phase adjustment unit 92 may be provided.

As such, according to this embodiment, a clock generating apparatus and a clock data recovering apparatus capable of improving the CID resistance can be provided.

What is claimed is:
1. A clock generating apparatus comprising:
a signal selector configured to receive a feedback clock, an edge signal, and an edge detection signal, wherein the edge signal has an edge at a timing according to a bit rate, and the edge detection signal varies between an edge-detection significant level and an edge-detection non-significant level, the edge detection signal being at the edge-detection significant level during a period, which includes the timing of the edge of the edge signal, the signal selector being further configured to selectively output, as a selected signal, the edge signal during a period in which the edge detection signal is at the edge-detection significant level, and to selectively output, as the selected signal, a signal obtained by logically inverting the feedback clock, during a period in which the edge detection signal is at the edge-detection non-significant level;

a phase delay comprising a plurality of delay elements connected in cascade, at respective positions, the phase delay being configured to input the selected signal to a first delay element among the plurality of delay elements, to delay the selected signal at each of the plurality of delay elements according to the respective positions, to generate respective delayed signals, and to output the respective delayed signals from the plurality of delay elements;

a timer configured to measure a unit interval time spanning between two consecutive edges of the edge signal corresponding to one bit passing, to compare levels of the delayed signals outputted from the delay elements, at a detection time within the unit interval time, to identify a level difference in the levels compared, between the delayed signals of consecutively positioned delay elements, and to detect a level change position, at one of the respective positions, corresponding to the consecutively positioned delay elements where the level difference was identified; and a phase selector configured to selectively output the delayed signal from one of the delay elements, corresponding to the level change position detected by the timer, as the feedback clock, and to selectively output one of the delayed signals outputted from one of the plurality of delay elements, as an output clock having a frequency corresponding to the bit rate of the edge signal;

a phase detector configured to detect a phase difference between the edge signal and the feedback clock; and a phase controller configured to control a signal selection operation by the phase selector, such that the phase difference detected by the phase detector decreases.

2. The clock generating apparatus according to claim 1, wherein the clock generating apparatus comprises a plurality of phase delays $D_1$ to $D_N$, as the phase delay, a plurality of timers $M_1$ to $M_N$ as the timer, and a plurality of phase selectors $S_1$ to $S_N$ as the phase selector, N being an integer of 2 or more, an n-th phase delay $D_n$ among the plurality of phase delays $D_1$ to $D_N$ comprises a first set of delay elements among the plurality of delay elements, connected in cascade, n being an integer between 1 and N, an n1-th phase delay $D_{n1}$, among the plurality of phase delays $D_1$ to $D_N$ includes a second set of delay elements among the plurality of delay elements, connected in cascade, n1 being an integer between 1 and N, a delayed time of each of the delay elements of the first set of delay elements and a delayed time of each of the delay elements of the second set of delay elements are different from each other, an n-th timer $M_n$ among the plurality of timers $M_1$ to $M_N$ measures the unit interval time and detects the level change position by comparing the levels of the delayed signals outputted from each of the first set of delay elements, an n-th phase selector $S_n$ among the plurality of phase selectors $S_1$ to $S_N$ selectively outputs the selected signal as the feedback clock, the selected signal corresponding to the selected delay element among the first set of delay elements, corresponding to the level change position detected by the n-th timer $M_n$, the signal selector receives the feedback clock outputted from the n-th phase selector $S_n$, a first phase delay $D_1$ among the plurality of phase delays $D_1$ to $D_N$, inputs the selected signal outputted from the signal selector to the first delay element, the first delay element being a first among the plurality of delay elements of the first phase delay $D_1$, the plurality of phase delays $D_1$ to $D_N$ including a second phase delay $D_2$, the second to N-th phase delays $D_2$ to $D_N$ other than the first phase delay $D_1$ input the feedback clock outputted from an (n−1)-th phase selector $S_{n-1}$ among the plurality of phase selectors, to respective first delay elements of each of the second to N-th phase delays $D_2$ to $D_N$, the n-th phase selector $S_n$ selectively outputs the output clock, wherein the one of the delayed signals outputted as the output clock is from one of the plurality of delay elements of the n-th phase delay $D_n$, and the signal selection operation controlled by the phase controller is a signal selection operation by any phase selector among the plurality of phase selectors $S_1$ to $S_N$.

3. The clock generating apparatus according to claim 1, wherein the plurality of delay elements are positioned from the first delay element to a last delay element, each of the delay elements having a delayed time, and among two delay elements selected from the plurality of delay elements, an initial-step-side delay element is positioned toward the first delay element and a final-step-side delay element is positioned toward the last delay element and a delayed time of the final-step-side delay element is longer than a delayed time of the initial-step-side delay element.

4. A clock data recovering apparatus for recovering a clock and data, using an input signal, comprising:

the clock generating apparatus according to claim 1;

an edge detector configured to delay the input signal to generate a delayed input signal, to generate the edge detection signal, and to output the edge detection signal to the clock generating apparatus;

a polarity detector configured to generate a logic inversion indication signal which varies between a logic-inversion-indication significant level and a logic-inversion-indication non-significant level, the logic inversion indication signal being at the logic-inversion-indication significant level when polarities of edges of the feedback clock and of the delayed input signal are the same during a period in which the edge detection signal is at the edge-detection significant level;

a logic inverter configured to receive the delayed input signal outputted from the edge detector and the logic inversion indication signal outputted from the polarity detector, the logic inverter being further configured to selectively output to the clock generating apparatus, as the edge signal, a signal obtained by logically inverting the delayed input signal, during a period in which the logic inversion indication signal is at the logic-inversion-indication significant level, and to selectively output the delayed input signal, as the edge signal, to the clock generating apparatus, during a period in which the logic inversion indication signal is at the logic-inversion-indication non-significant level; and a data output unit configured to sample data of the delayed input signal at a timing indicated by the output clock outputted from the clock generating apparatus and to output held sampling data, wherein the output clock outputted from the clock generating apparatus is output as a recovered clock recovered using the input signal and the held sampling data outputted from the data output unit is output as recovered data recovered using the input signal.

5. The clock data recovering apparatus according to claim 4, further comprising:

an input signal phase detector configured to detect a phase relation between the feedback clock and the delayed input signal; and an input signal phase adjuster configured to adjust a phase of the delayed input signal inputted to the data output unit to optimize the phase relation detected by the input signal phase detection unit.

6. A clock data recovering apparatus for recovering a clock and data, using an input signal, comprising:

the clock generating apparatus according to claim 2;

an edge detector configured to delay the input signal to generate a delayed input signal, to generate the edge detection signal, and to output the edge detection signal to the clock generating apparatus;

a polarity detector configured to generate a logic inversion indication signal which varies between a logic-inversion-indication significant level and a logic-inversion-indication non-significant level, the logic inversion indication signal being at the logic-inversion-indication significant level when polarities of edges of the feedback clock and of the delayed input signal are the same during a period in which the edge detection signal is at the edge-detection significant level;

a logic inverter configured to receive the delayed input signal outputted from the edge detector and the logic inversion indication signal outputted from the polarity detector, the logic inverter being further configured to selectively output to the clock generating apparatus, as the edge signal, a signal obtained by logically inverting the delayed input signal, during a period in which the logic inversion indication signal is at the logic-inversion-indication significant level, and to selectively output the delayed input signal as the edge signal to the clock generating apparatus, during a period in which the logic inversion indication signal is at the logic-inversion-indication non-significant level; and a data output unit configured to sample data of the delayed input signal at a timing indicated by the output clock outputted from the clock generating apparatus and to output held sampling data, wherein the output clock outputted from the clock generating apparatus is output as a recovered clock recovered using the input signal and the held sampling data outputted from the data output unit is output as recovered data recovered using the input signal.

7. The clock data recovering apparatus according to claim 6, further comprising:

an input signal phase detector configured to detect a phase relation between the feedback clock and the delayed input signal; and an input signal phase adjuster configured to adjust a phase of the delayed input signal inputted to the data output unit to optimize the phase relation detected by the input signal phase detector.

8. A clock data recovering apparatus for recovering a clock and data using an input signal, comprising:

the clock generating apparatus according to claim 3;

an edge detector configured to delay the input signal to generate a delayed input signal, to generate the edge detection signal, and to output the edge detection signal to the clock generating apparatus;

a polarity detector configured to generate a logic inversion indication signal which varies between a logic-inversion-indication significant level and a logic-inversion-indication non-significant level, the logic inversion indication signal being at the logic-inversion-indication significant level when polarities of edges of the feedback clock and of the delayed input signal are the same during a period in which the edge detection signal is at the edge-detection significant level;

a logic inverter configured to receive the delayed input signal outputted from the edge detector and the logic inversion indication signal outputted from the polarity detector, the logic inverter being further configured to selectively output to the clock generating apparatus, as the edge signal, a signal obtained by logically inverting the delayed input signal, during a period in which the logic inversion indication signal is at the logic-inversion-indication significant level, and to selectively output the delayed input signal as the edge signal to the clock generating apparatus, during a period in which the logic inversion indication signal is at the logic-inversion-indication non-significant level; and a data output unit configured to sample data of the delayed input signal at a timing indicated by the output clock outputted from the clock generating apparatus and to output held sampling data, wherein the output clock outputted from the clock generating apparatus is output as a recovered clock recovered using the input signal and the held sampling data outputted from the data output unit is output as recovered data recovered using the input signal.

9. The clock data recovering apparatus according to claim 8, further comprising:

an input signal phase detector configured to detect a phase relation between the feedback clock and the delayed input signal; and an input signal phase adjuster configured to adjust a phase of the delayed input signal input to the data output unit to optimize the phase relation detected by the input signal phase detector.

10. The clock generating apparatus according to claim 1, wherein the detection time of the unit interval time measured by the timer is at a falling edge of the edge signal.

* * * * *